US012101988B2

(12) United States Patent
Park et al.

(10) Patent No.: US 12,101,988 B2
(45) Date of Patent: Sep. 24, 2024

(54) DISPLAY DEVICE

(71) Applicant: Samsung Display Co., LTD., Yongin-si (KR)

(72) Inventors: Ju Chan Park, Seoul (KR); Min Soo Kim, Seoul (KR); Sun Ho Kim, Seongnam-si (KR); Hyun Kim, Seoul (KR); Sun Hee Lee, Hwaseong-si (KR); Seung Hwan Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 313 days.

(21) Appl. No.: 17/605,662

(22) PCT Filed: Dec. 27, 2019

(86) PCT No.: PCT/KR2019/018655
§ 371 (c)(1),
(2) Date: Oct. 22, 2021

(87) PCT Pub. No.: WO2020/218704
PCT Pub. Date: Oct. 29, 2020

(65) Prior Publication Data
US 2022/0209148 A1 Jun. 30, 2022

(30) Foreign Application Priority Data
Apr. 23, 2019 (KR) .......................... 10-2019-0047228

(51) Int. Cl.
*H10K 77/10* (2023.01)
*B32B 27/08* (2006.01)
(Continued)

(52) U.S. Cl.
CPC ............ *H10K 77/111* (2023.02); *B32B 27/08* (2013.01); *B32B 27/281* (2013.01);
(Continued)

(58) Field of Classification Search
CPC ............ H10K 77/111; H10K 2102/311; H10K 59/12; H10K 59/00; H10K 50/00;
(Continued)

(56) References Cited

U.S. PATENT DOCUMENTS

2011/0050657 A1 3/2011 Yamada
2013/0222719 A1 8/2013 Matsumoto et al.
(Continued)

FOREIGN PATENT DOCUMENTS

CN 108766977 A 11/2018
KR 1020170085344 7/2017
(Continued)

OTHER PUBLICATIONS

International Search Report—PCT/KR2019/018655 dated Apr. 16, 2020.

*Primary Examiner* — Douglas W Owens
(74) *Attorney, Agent, or Firm* — CANTOR COLBURN LLP

(57) ABSTRACT

A display device includes a display area including a corner portion, a display panel including a non-display area located around the display area, and a cover window disposed on the display panel. The display panel includes a flexible substrate, and a crack propagation prevention pattern including a first organic layer disposed on the flexible substrate and directly contacting the flexible substrate. The intersecting point of a bending line overlaps with the crack propagation prevention pattern in the a thickness direction. In addition, the display device further includes alignment marks which overlap with the bending line.

20 Claims, 25 Drawing Sheets

(51) Int. Cl.
 *B32B 27/28* (2006.01)
 *H10K 102/00* (2023.01)
(52) U.S. Cl.
 CPC .................. *B32B 2307/202* (2013.01); *B32B 2307/206* (2013.01); *B32B 2307/412* (2013.01); *B32B 2457/20* (2013.01); *H10K 2102/311* (2023.02)
(58) Field of Classification Search
 CPC ............. H10K 2102/302; B32B 27/08; B32B 27/281; B32B 2307/202; B32B 2307/206; B32B 2307/412; B32B 2457/20; B32B 3/02; B32B 9/00; B32B 9/041; B32B 9/045; B32B 15/20; B32B 27/286; B32B 27/302; B32B 27/304; B32B 2255/10; B32B 2255/20; B32B 2307/546; B32B 9/04; B32B 23/00; B32B 27/365; B32B 2255/24; B32B 2307/7244; B32B 27/308; B32B 2307/7265
 See application file for complete search history.

(56) References Cited

U.S. PATENT DOCUMENTS

| 2015/0138041 | A1 | 5/2015 | Hirakata et al. |
| 2018/0114470 | A1 | 4/2018 | Nagamaya et al. |
| 2019/0165076 | A1* | 5/2019 | Lee ..................... H10K 59/131 |

FOREIGN PATENT DOCUMENTS

| KR | 1020180065722 | 6/2018 |
| KR | 1020180118488 | 10/2018 |
| KR | 1020180123604 | 11/2018 |
| KR | 1020180128517 | 12/2018 |

* cited by examiner

DA: DA1, DA2, DA3, DA4, DA5
NA: NA1, NA2, NA3, NA4, NA5, NA6, NA7, NA8

DA: DA1, DA2, DA3, DA4, DA5
NA: NA1, NA2, NA3, NA4, NA5, NA6, NA7, NA8

DA: DA1, DA2, DA3, DA4, DA5
NA: NA1, NA2, NA3, NA4, NA5, NA6, NA7, NA8

DA: DA1, DA2, DA3, DA4, DA5
NA: NA1, NA2, NA3, NA4, NA5, NA6, NA7, NA8

DISPLAY DEVICE

This application is the national phase of International Application No. PCT/KR2019/018655, which claims priority to Korean Patent Applications No. 10-2019-0047228 filed on Apr. 23, 2019, and all the benefits accruing therefrom under 35 U.S.C. § 119, the content of which in their entirety is herein incorporated by reference.

BACKGROUND

1. Field

Embodiments of the present disclosure relate to a display device.

2. Description of the Related Art

An electronic device, such as a smart phone, a tablet personal computer ("PC"), a digital camera, a notebook computer, a navigator and a smart television, which provides a user with an image, includes a display device for displaying an image. The display device includes a display panel for generating an image to display the image, and various input devices.

Among display devices, an organic light emitting display device displays an image by an organic light emitting diode that generates light through recombination of electrons and holes. The organic light emitting display device has a fast response speed, high luminance and a wide viewing angle, and also, may be driven at low power consumption.

The display device generally displays an image on only a front portion, but a display device for displaying an image even at a side portion is being recently developed.

SUMMARY

A feature of the invention is to provide a display device in which a bending stress of a side portion of a display panel, particularly a side portion disposed in an oblique direction is relaxed.

The features of the invention are not limited to those mentioned above, and additional features of the invention, which are not mentioned herein, will be clearly understood by those skilled in the art from the following description of the invention.

A display device in an embodiment to achieve the above features includes a display panel including a corner portion and including a display area and a non-display area disposed in the periphery of the display area, and a cover window disposed on the display panel. The display panel includes a flat portion, a first side portion bent in a thickness direction based on a first bending line extended from a first side of the flat portion along a first direction, a second side portion bent in the thickness direction based on a second bending line extended from a second side of the flat portion along a second direction crossing the first direction, and a third side portion surrounded by the corner portion, the first bending line and the second bending line and bent in the thickness direction based on the first bending line and the second bending line, the flat portion includes a first display area of the display area, the first side portion includes a first non-display area of the non-display area, and a second display area of the display area disposed between the first non-display area and the first display area, the second side portion includes a second non-display area of the non-display area, and a third display area of the display area disposed between the second non-display area and the first display area, the third side portion includes a third non-display area of the non-display area, each of the display areas includes a plurality of pixels, an intersection point of the first bending line and the second bending line is disposed in the third non-display area, the display panel includes a flexible substrate, and a crack propagation prevention pattern disposed on the flexible substrate, including a first organic layer directly contacting the flexible substrate, and the intersection point overlaps the crack propagation prevention pattern in the thickness direction.

In an embodiment, each of the first non-display area to the third non-display area may include a plurality of scan driving circuits spaced apart from one another and connected with pixels of the display area adjacent thereto among the plurality of pixels, and a spaced distance between adjacent scan driving circuits of the third non-display area among the plurality of scan driving circuits may be greater than a spaced distance between the adjacent scan driving circuits of the first non-display area among the plurality of scan driving circuits.

In an embodiment, the crack propagation prevention pattern may be disposed in a gap space between the adjacent scan driving circuits of the third non-display area in a plan view.

In an embodiment, each of the first non-display area to the third non-display area may include a plurality of light emission control driving circuits spaced apart from one another and connected with the pixels of the display area adjacent thereto, and a spaced distance between adjacent light emission control driving circuits of the third non-display area among the plurality of light emission control driving circuits may be greater than a spaced distance between adjacent light emission control driving circuits of the first non-display area among the plurality of light emission control driving circuits.

In an embodiment, the scan driving circuit and the light emission control driving circuit, which are connected to a same pixel among the plurality of pixels, may be aligned in a direction oriented toward the display area adjacent thereto.

In an embodiment, the crack propagation prevention pattern may be disposed even in a gap space between the adjacent light emission control driving circuits of the third non-display area in the plan view.

In an embodiment, the crack propagation prevention pattern may further be disposed in a gap space between the scan driving circuit of the third non-display area and the scan driving circuit of the first non-display area, which are adjacent to each other in the plan view.

In an embodiment, the display panel may include a buffer layer disposed on the flexible substrate, a first insulating layer disposed on the buffer layer and a second insulating layer disposed on the first insulating layer, and an open portion may be defined in the buffer layer, the first insulating layer and the second insulating layer in an area overlapped with the crack propagation prevention pattern.

In an embodiment, the crack propagation prevention pattern may contact exposed sides of the buffer layer, the first inorganic layer and the second inorganic layer.

In an embodiment, the display panel may further include a second organic layer disposed on the second inorganic layer, and a third organic layer disposed on the second organic layer, and the crack propagation prevention pattern may further include the second organic layer and the third organic layer, which overlap the first organic layer.

In an embodiment, an inorganic material may not be disposed in an area overlapped with the crack propagation prevention pattern in the thickness direction.

In an embodiment, the display panel may further include a crack induction pattern disposed on the flexible substrate and surrounded by the crack propagation prevention pattern in a plan view, and the crack induction pattern may include an inorganic layer.

In an embodiment, the crack induction pattern may further include a conductive layer.

In an embodiment, a side of the crack induction pattern may directly contact the crack propagation prevention pattern.

A display device in another embodiment to solve the above problems includes a display panel including a corner portion and including a display area and a non-display area disposed in a periphery of the display area, and a cover window disposed on the display panel. The display panel includes a flat portion, a first side portion bent in a thickness direction based on a first bending line extended from a first side of the flat portion along a first direction, a second side portion bent in the thickness direction based on a second bending line extended from a second side of the flat portion along a second direction crossing the first direction, and a third side portion surrounded by the corner portion, the first bending line and the second bending line and bent in the thickness direction based on the first bending line and the second bending line, and the display panel includes a first align mark overlapping the first bending line and disposed on the second side portion and the third side portion in a plan view, and a second align mark overlapping the second bending line and disposed on the second side portion and the third side portion in the plan view.

In an embodiment, the first align mark and the second align mark may include a plurality of deposited conductive layers having a same size in the plan view.

In an embodiment, the first bending line and the second bending line may respectively pass through the flat portion.

In an embodiment, each of the first align mark and the second align mark may include an intersection point of the first bending line and the second bending line.

In an embodiment, the intersection point of the first bending line and the second bending line may be disposed outside the corner portion.

In an embodiment, the display panel may further include a third side portion bent in the thickness direction based on a third bending line extended from a third side of the flat portion along the first direction, and a fourth side portion bent in the thickness direction based on a fourth bending line extended from a fourth side of the flat portion along the second direction, the first bending line and the third bending line may be parallel with each other, and the second bending line and the fourth bending line may be parallel with each other.

Details of the other embodiments are included in the detailed description and drawings.

According to the display device of an embodiment, a bending stress of a side portion of a display panel, particularly a side portion disposed in an oblique direction may be relaxed.

The effects in the embodiment of the invention are not limited to those mentioned above, and more various effects are included in the following description of the invention.

BRIEF DESCRIPTION OF THE DRAWINGS

The above and other embodiments, advantages and features of this invention will become more apparent by describing in further detail embodiments thereof with reference to the accompanying drawings.

DETAILED DESCRIPTION

Advantages and features of the invention, and implementation methods thereof will be clarified through the following embodiments described with reference to the accompanying drawings. The invention may, however, be embodied in different forms and should not be construed as being limited to the embodiments set forth herein. Rather, these embodiments are provided so that this invention will be thorough and complete, and will fully convey the scope of the invention to those skilled in the art. Further, the invention is only defined by the scope of the claims.

A case in which an element or a layer is "on" another element or layer includes all cases in which not only the element or layer are directly on another element or layer but also another element or layer is interposed between the element or layer and the other element or layer. The same reference numbers will be used throughout the disclosure to refer to the same or like parts.

It will be understood that, although the terms such as "first" and/or "second" may be used herein to describe various elements, these elements should not be limited by these terms. These terms are only used to identify one element from another element. Thus, a first element discussed below may be referred to as a second element within technical spirits of the invention.

Hereinafter, detailed embodiments will be described with reference to the accompanying drawings.

Figure 1:
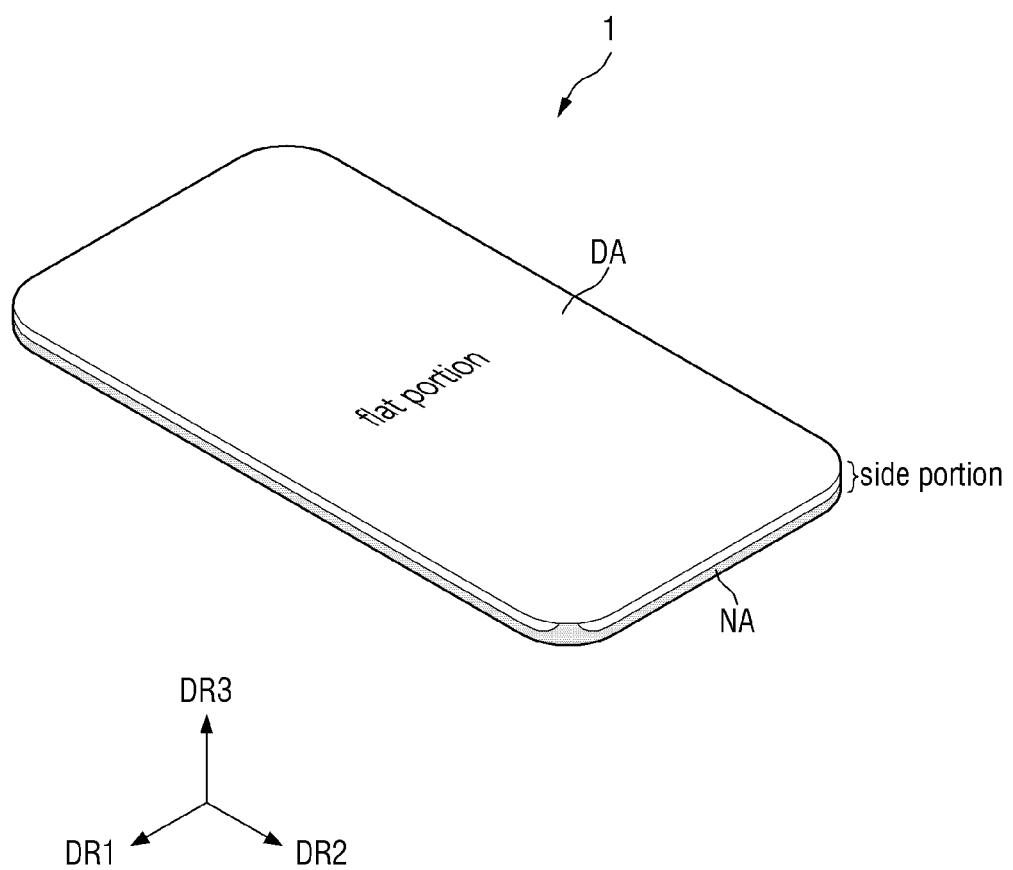
FIG. 1 is a perspective view illustrating an embodiment of a display device.
Figure 2:
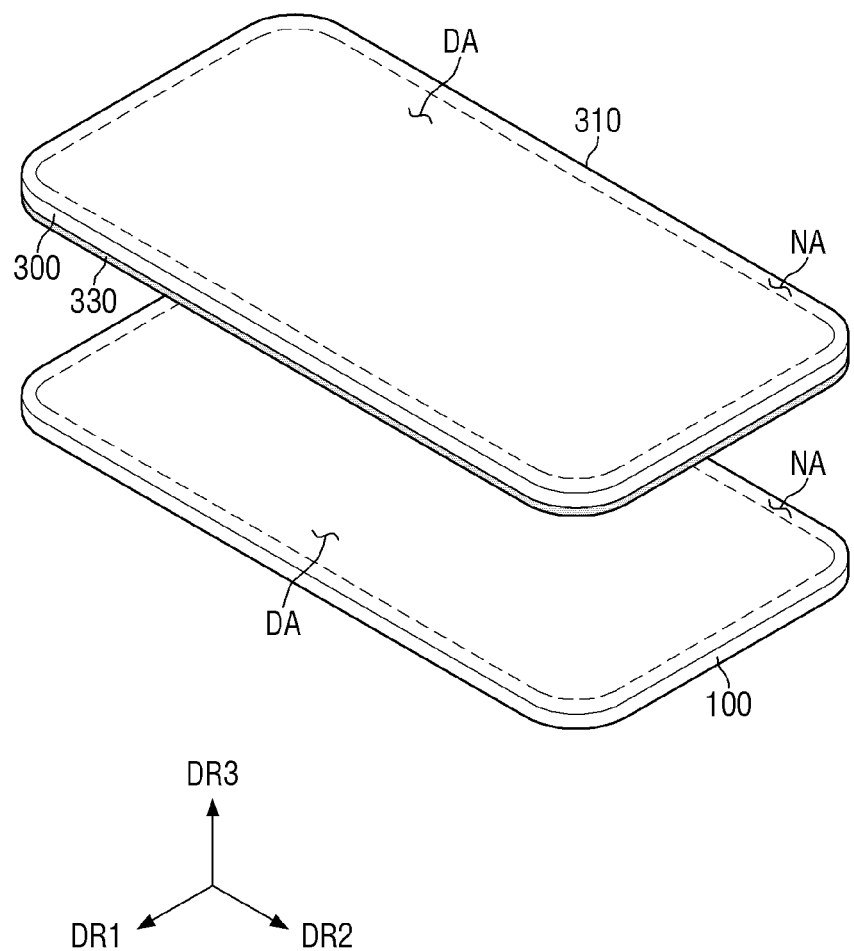
FIG. 2 is an exploded perspective view illustrating a display device.
Figure 3A:
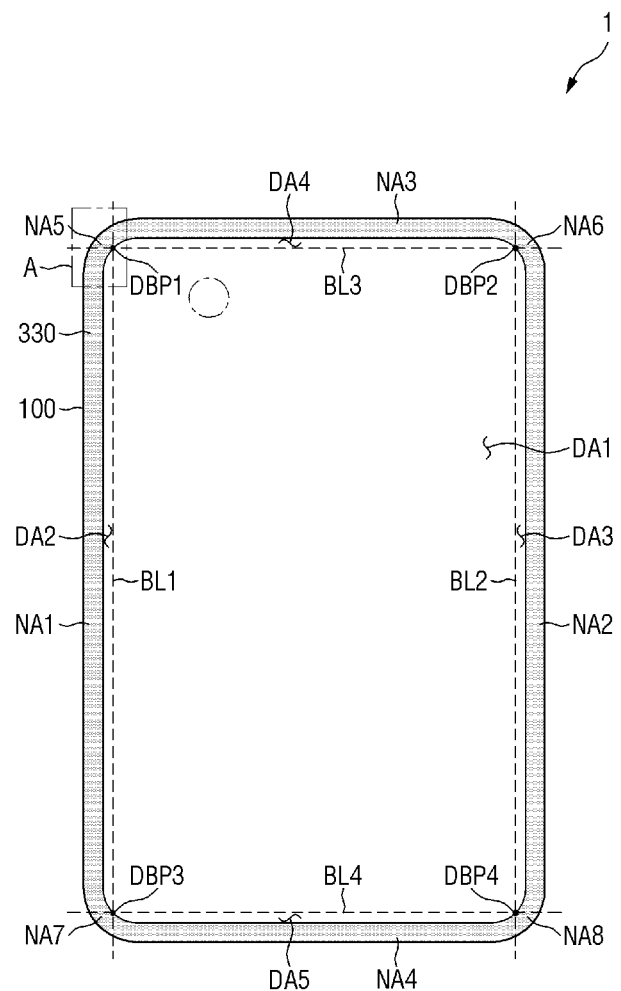
FIG. 3A is a plan view illustrating an embodiment of a display panel.
Figure 3A:
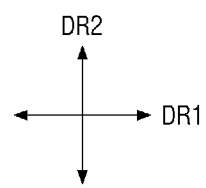
Figure 3B:
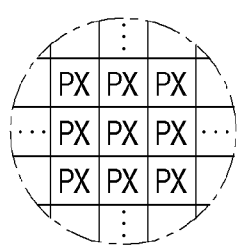
FIG. 3B is an enlarged view of a dotted circle portion of FIG. 3A.
Figure 4:
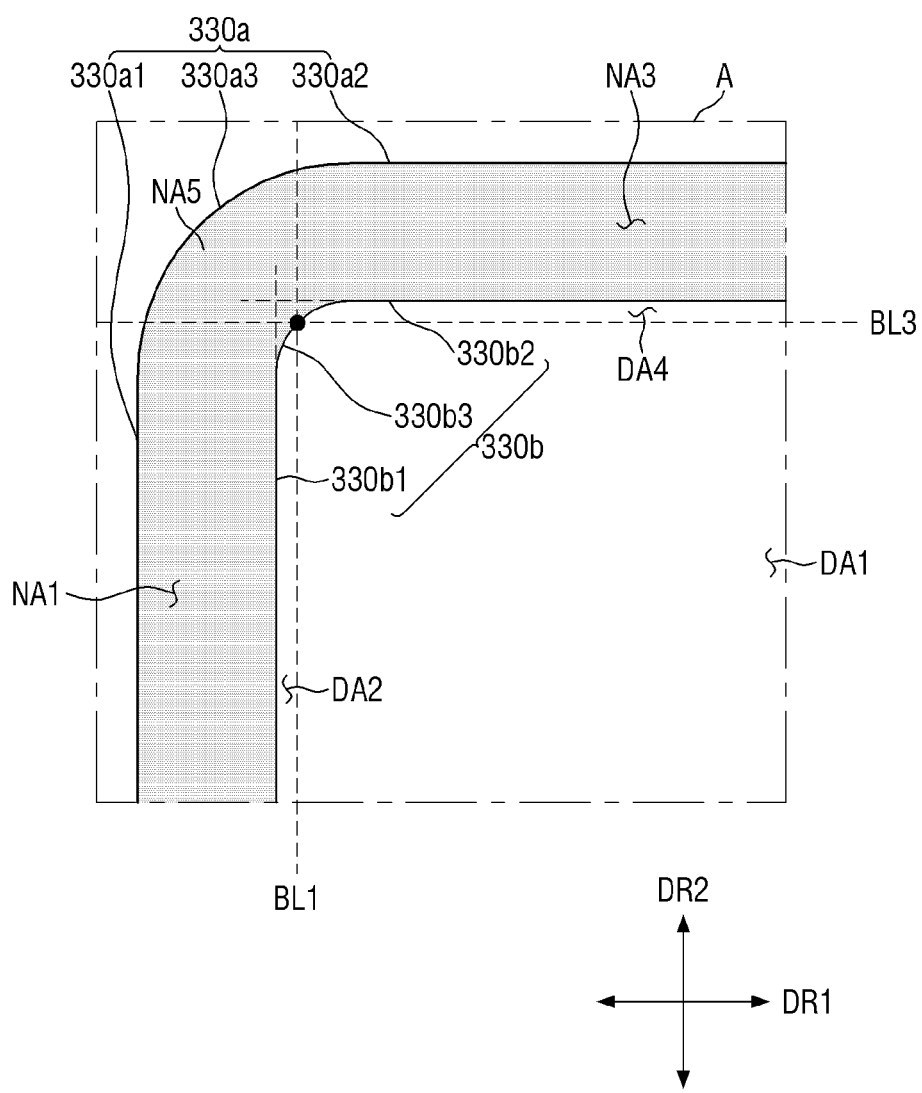
FIG. 4 is an enlarged view of an area A of FIG. 3A.
Figure 5:
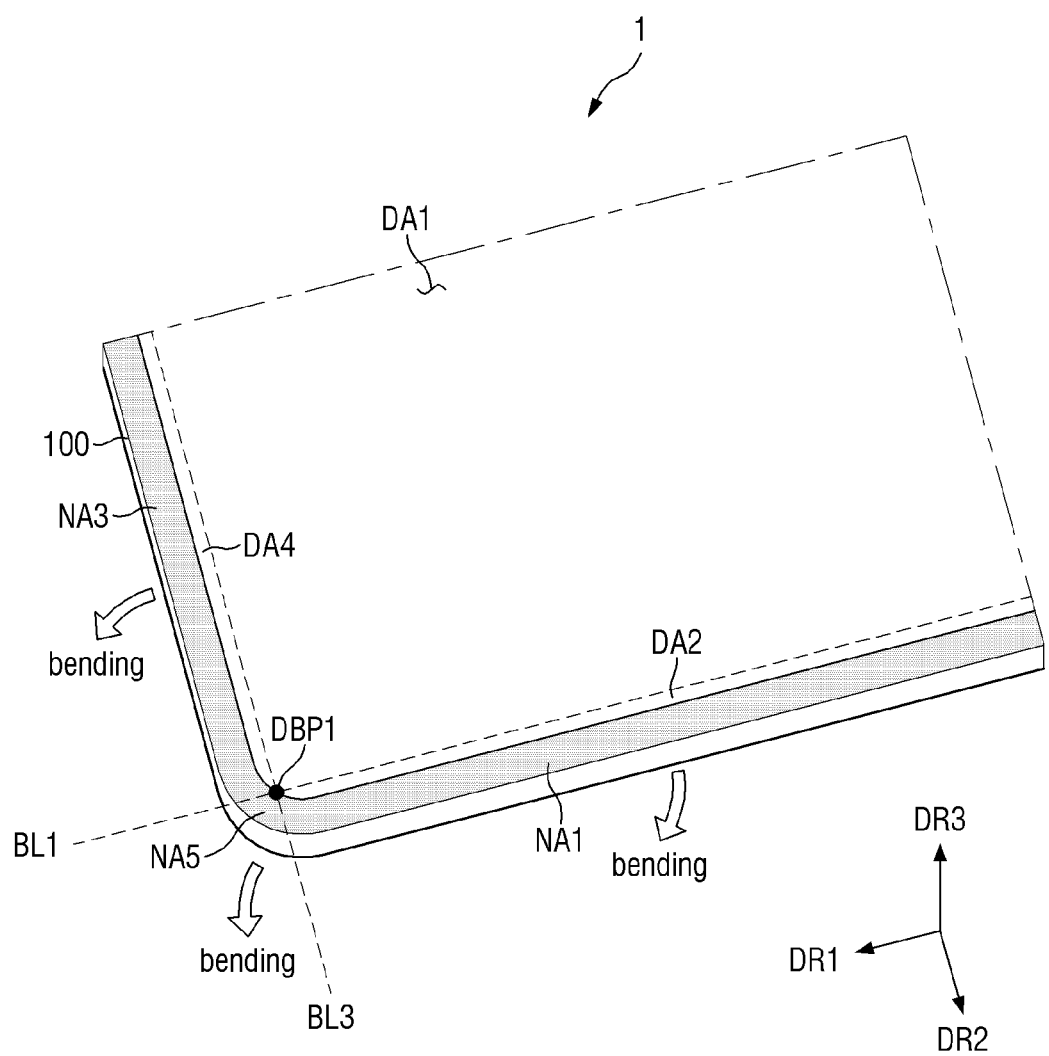
FIG. 5 is a plan view illustrating that a display panel in an embodiment is bent.
Figure 6A:
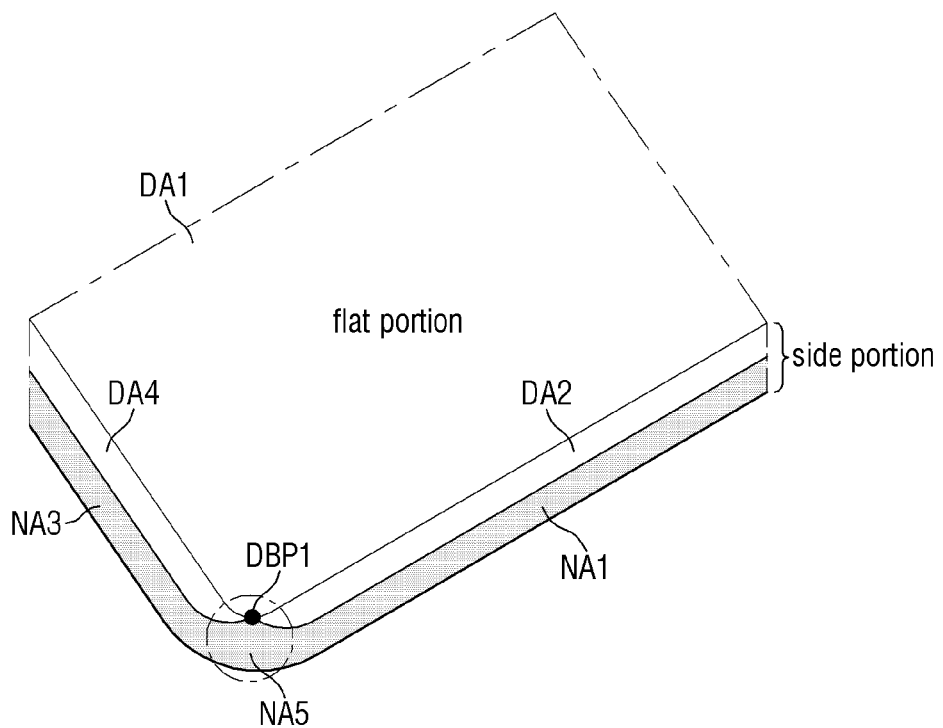
FIG. 6A is a perspective view illustrating a display device bent in accordance with FIG. 5.
Figure 6B:
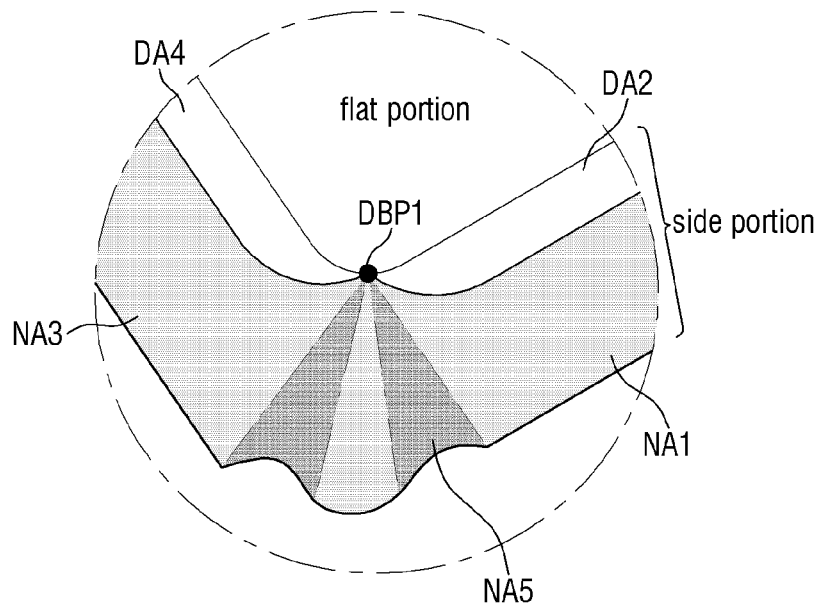
FIG. 6B is an enlarged view of a dotted circle portion of FIG. 6A.

FIG. 1 is a perspective view illustrating an embodiment of a display device, FIG. 2 is an exploded perspective view illustrating an embodiment of a display device, FIG. 3A is a plan view illustrating an embodiment of a display panel, FIG. 3B is an enlarged view of a dotted circle portion of FIG. 3A, FIG. 4 is an enlarged view of an area A of FIG. 3A, FIG. 5 is a plan view illustrating that a display panel in an embodiment is bent, FIG. 6A is a perspective view illustrating a display device bent in accordance with FIG. 5, and FIG. 6B is an enlarged view of a dotted circle portion of FIG. 6A.

In the embodiments, a first direction DR1 and a second direction DR2 mutually cross each other in their respective directions different from each other, and indicate directions vertically crossing each other in the plan view, for example. A third direction DR3 is a direction crossing the plane on which the first direction DR1 and the second direction DR2 are arranged, and, for example, indicates a direction vertically crossing the first direction DR1 and the second direction DR2. In the illustrated drawing, the first direction DR1 indicates a horizontal direction of the display device 1, the second direction DR2 indicates a vertical direction of the display device 1, and the third direction DR3 indicates a thickness direction of the display device 1. In the following embodiments, one side of the first direction DR1 refers to a right direction in the plan view, the other side of the first direction DR1 refers to a left direction in the plan view, one side of the second direction DR2 refers to an upper direction in the plan view, the other side of the second direction DR2 refers to a lower direction in the plan view, one side of the third direction DR3 refers to an upper direction in the cross-sectional view, and the other side of the third direction DR3 refers to a lower direction in the cross-sectional view. However, it is to be understood that the directions mentioned in the embodiment refer to relative directions, and the embodiment is not limited to the mentioned directions.

Referring to FIGS. 1 to 6, the display device 1 displays a video or still image. A display direction of a main screen may be one side (e.g., top emission display device) of the third direction DR3 but may be the other side (e.g., bottom emission display device) of the third direction DR3, or may be both one side and the other side (e.g., dual emission display device or transparent display device) of the third direction DR3.

The display device 1 may refer to all electronic devices that provide a display screen. In an embodiment, a television, a laptop computer, a monitor, signboard and Internet of Things as well as a portable electronic device, which provides a display screen, such as a mobile phone, a smart phone, a table personal computer ("PC"), an electronic watch, a smart watch, a watch phone, a mobile communication terminal, an electronic diary, an electronic book, a portable multimedia player ("PMP"), a navigator, a game machine, and a digital camera, may be included in the display device 1.

The display device 1 includes a display area DA for displaying a screen, and a non-display area NA disposed in the periphery of the display area DA, for not displaying a screen. The non-display area NA may be a bezel area. The non-display area NA may overlap a printing layer 330 of a window member (also referred to as a cover member) 300, which will be described later.

A plane shape of the display area DA may have a quadrangular (e.g., rectangular) shape with rounded corners. The plane shape of the display area DA, which is illustrated, is a rectangular shape of which first direction DR1 is longer than the second direction DR2, but is not limited thereto. The display area DA may have various shapes such as a rectangular shape of which second direction DR2 is longer than the first direction DR1, a square shape, other polygonal shapes, a circular shape and an elliptical shape.

The non-display area NA is disposed in the periphery of the display area DA. When a quadrangular (e.g., rectangular) shape with rounded corners is applied to the plane shape of the display area DA, the non-display area NA may be disposed in the periphery of both short sides and both long sides of the display area DA. That is, the non-display area NA may have a plane shape fully surrounding the display area DA in the plan view, for example, a quadrangular (e.g., rectangular) frame shape with rounded corners.

The display device 1 includes a flat portion disposed on one plane, and a side portion disposed at a side of the flat portion. The side portion may be disposed on another plane. The flat portion of the display device 1 may view one side of the third direction DR3, and the side portion may view a side direction crossing the direction viewed from the flat portion. When the plane shape of the display device 1 has a rounded quadrangular (e.g., rectangular) shape, the display device 1 may include four side portions. Each side portion may be disposed on another plane different from the other side portions. The side portions may be at right angle with the flat portion but may be at acute angle or obtuse angle with the flat portion without being limited to the right angle.

The display area DA of the display device 1 is mainly disposed in the flat portion, and may partially be disposed at the side portions. The non-display area NA may be disposed at the side portions of the display device 1. That is, the display area DA disposed at the side portions may generally be connected with the display area DA disposed in the flat portion at each side portion, and the non-display area NA disposed at the side portions may be disposed to be spaced apart from the display area DA disposed in the flat portion by interposing the display area DA disposed at the side portions. However, as shown in FIG. 1, the non-display area NA may directly and physically be connected with the display area DA disposed in the flat portion at side portions of corners of the plane of the display device 1.

Referring to FIG. 2, the display device 1 may include a display panel 100 providing a display screen, and a window member 300 disposed above the display panel 100 to cover and protect the display panel 100.

Examples of the display panel 100 may include an organic light emitting display panel, a micro light emitting diode ("LED") display panel, a nano LED display panel, a quantum-dot light emitting display panel, a liquid crystal display panel, a plasma display panel, an electric field emission display panel, an electrophoresis display panel, and an electrowetting display panel. Hereinafter, the organic light emitting display panel is applied as an embodiment of the display panel 100 but the display panel 100 is not limited to the organic light emitting display panel, and another display panel may be used as the display panel 100 within the range that the same technical spirits are applied thereto.

The display panel 100 includes a plurality of pixels. Each pixel may include a light emitting layer and a circuit layer for controlling the amount of light emission of the light emitting layer. The circuit layer may include a display line, a display electrode, and at least one transistor. The light emitting layer may include an organic light emitting material. The light emitting layer may be encapsulated by an encapsulation film. The encapsulation film may prevent external water from entering the light emitting layer by encapsulating the light emitting layer. The encapsulation film may include a single or multi-layered film of an inorganic film, or may include a deposited film of an inorganic film and an organic film, which are alternately deposited.

The display panel 100 may include a flexible substrate that includes a flexible polymer material such as polyimide. Therefore, the display panel 100 may be twisted, bent, folded or rolled.

The window member 300 may include a window base 310 and a printing layer 330 disposed on the window base 310.

The window base 310 may include a transparent material. The window base 310 may include, for example, glass or plastic. When the window base 310 includes plastic, the window base 310 may have a flexible property.

Examples of plastic applicable to the window base 310 may include, but are not limited to, polyimide, polyacrylate, polymethylmethacrylate ("PMMA"), polycarbonate, polyethylenenaphthalate ("PEN"), polyvinylidene chloride, polyvinylidene difluoride ("PVDF"), polystyrene, ethylene vinylalcohol copolymer, polyethersulphone ("PES"), polyetherimide ("PEI"), polyphenylene sulfide ("PPS"), polyallylate, tri-acetyl cellulose ("TAC"), and cellulose acetate propionate ("CAP"). The plastic window may include one or more of the plastic materials listed above. When the window base 310 includes plastic, it may further include a coating layer (not shown) disposed on upper and lower surfaces of plastic. In an embodiment, the coating layer may be an organic layer that includes an acrylate compound and/or a hard coating layer that includes an organic and inorganic composite layer.

A plane shape of the window base 310 corresponds to a shape of the display device 1, which is applied thereto. In an embodiment, when the display device 1 has a substantial quadrangular (e.g., rectangular) shape in the plan view, the window base 310 also has a substantial quadrangular (e.g., rectangular) shape, for example. In another embodiment, when the display device 1 has a circular shape, the window base 310 also has a circular shape.

The window base 310 is greater than the display panel 100 in the plan view, and its side may be protruded from the side of the display panel 100. The window base 310 may outwardly be protruded from all sides (four sides in the drawing) of the display panel 100.

The printing layer 330 may be disposed on the window base 310. The printing layer 330 may be disposed on one surface and/or the other surface of the window base 310. The printing layer 330 may be disposed at an edge portion of the window base 310, and may be disposed in the non-display area NA. The printing layer 330 may be a decorative layer giving an esthetic effect and/or an outmost black matrix layer.

Another panel such as a touch panel or an optical film such as a polarizing film may be interposed between the display panel 100 and the window member 300. Since various structures and manufacturing methods regarding the panel or the optical film are widely known in the art to which the invention pertains, their detailed description will be omitted.

Referring to FIG. 3B, the display panel 100 may include a plurality of pixels PX. The plurality of pixels PX may be arranged in a matrix direction. A shape of each pixel PX may be a quadrangular (e.g., rectangular) shape or a square shape in the plan view, but is not limited to. The shape of each pixel PX may be a rhombus shape of which sides are respectively inclined with respect to the first direction DR1. Each pixel PX may include a light emitting area. Each light emitting area may have the same shape as that of the pixel PX but may have a shape different from that of the pixel PX. In an embodiment, when the shape of the pixel PX is a quadrangular (e.g., rectangular) shape, a light emitting area of the corresponding pixel PX may have various shapes such as a quadrangular (e.g., rectangular) shape, a rhombus shape, a hexagonal shape, an octagonal shape, and a circular shape, for example.

Edges of the display panel 100 may be curved based on a plurality of bending lines BL1 to BL4 to form a curve, or may be bent in a vertical direction. The first bending line BL1 may be disposed at the other side of the first direction DR1 of the display panel 100 and extended along the second direction DR2, the second bending line BL2 may be disposed at one side of the first direction DR1 of the display panel 100 and extended along the second direction DR2, the third bending line BL3 may be disposed at one side of the second direction DR2 of the display panel 100 and extended along the first direction DR1, and the fourth bending line BL4 may be disposed at the other side of the second direction DR2 of the display panel 100 and extended along the first direction DR1. The first bending line BL1 and the second bending line BL2 may be extended in parallel with each other, and the third bending line BL3 and the fourth bending line BL4 may be extended in parallel with each other. The first bending line BL1 and the second bending line BL2 may respectively cross the third bending line BL3 and the fourth bending line BL4. In an embodiment, the first bending line BL1 and the second bending line BL2 may respectively be extended to be perpendicular to the third bending line BL3 and the fourth bending line BL4, for example, but are not limited thereto.

The bending lines BL1 to BL4 may be extended to cross both the display area DA and the non-display area NA of the display device 1. As a result, at least a portion of the display area DA as well as the non-display area NA may be disposed at the side portions of the display device 1.

The bending lines BL1 to BL4 form intersection points with the other bending lines that cross one another. In an embodiment, the first bending line BL1 and the third bending line BL3 may form a first bending intersection point DBP1 near corners at the other side of the first direction DR1 of the display panel 100 and one side of the second direction DR2, the second bending line BL2 and the third bending line BL3 may form a second bending intersection point DBP2 near corners at one side of the first direction DR1 of the display panel 100 and one side of the second direction DR2, the first bending line BL1 and the fourth bending line BL4 may form a third bending intersection point DBP3 near corners at the other side of the first direction DR1 of the display panel 100 and the other side of the second direction DR2, and the second bending line BL2 and the fourth bending line BL4 may form a fourth bending intersection point DBP4 near corners at one side of the first direction DR1 of the display panel 100 and the other side of the second direction DR2, for example.

The bending intersection points DBP1 to DBP4 may be disposed in the display panel 100. The bending intersection points DBP1 to DBP4 may be disposed in the non-display area NA. That is, as the bending intersection points DBP1 to DBP4 are disposed in the non-display area NA, when the display panel 100 is bent through the bending lines BL1 to BL4, some of the non-display area NA are together bent at the corners of the display panel 100, whereby a screen ratio of the non-display area NA may be reduced in the flat portion.

Since the display panel 100 is simultaneously bent at the bending intersection points DBP1 to DBP4 by two bending lines crossing each other, a bending stress may be greater at the bending intersection points DBP1 to DBP4 than the area bent by one bending line. That is, the bending stress may be greater in the non-display areas NA in which the bending intersection points DBP1 to DBP4 are disposed than the non-display area NA in which the bending intersection points DBP1 to DBP4 are not disposed.

In an embodiment of the display panel 100, the bending intersection points DBP1 to DBP4 are disposed in the non-display area NA, whereby a bending stress caused by dual bending may be prevented from occurring in the display area DA of the display panel 100.

The display area DA and the non-display area NA are divided into a plurality of areas based on the bending lines BL1 to BL4. The display area DA may include first to fifth display areas DA1 to DA5 identified by the bending lines BL1 to BL4, and the non-display area NA may include first to eighth non-display areas NA1 to NA8 identified by the bending lines BL1 to BL4.

The first display area DA1 may be surrounded by the bending lines BL1 to BL4 and disposed at the center portion of the display panel 100. The first display area DA1 may be disposed at a right side of the first bending line BL1, a left side of the second bending line BL2, a lower side of the third bending line BL3 and an upper side of the fourth bending line BL4. The second display area DA2 may be disposed at a left side of the first bending line BL1, and may physically be connected with the first display area DA1 by the first bending line BL1 as a boundary. The third display area DA3 may be disposed at a right side of the second bending line BL2, and may physically be connected with the first display area DA1 by the second bending line BL2 as a boundary. The fourth display area DA4 may be disposed at an upper side of the third bending line BL3, and may physically be connected with the first display area DA1 by the third bending line BL3 as a boundary. The fifth display area DA5 may be disposed at a lower side of the fourth bending line BL4, and may physically be connected with the first display area DA1 by the fourth bending line BL4 as a boundary.

The first non-display area NA1 may be disposed at the other side of the first direction DR1 of the second display area DA2 and spaced apart from the first display area DA1 by interposing the second display area DA2, the second non-display area NA2 may be disposed at one side of the first direction DR1 of the third display area DA3 and spaced apart from the first display area DA1 by interposing the third display area DA3, the fourth non-display area NA4 may be disposed at one side of the second direction DR2 of the fourth display area DA4 and spaced apart from the first display area DA1 by interposing the fourth display area DA4, and the fifth non-display area NA5 may be disposed at the other side of the second direction DR2 of the fifth display area DA5 and spaced apart from the first display area DA1 by interposing the fifth display area DA5.

The fifth non-display area NA5 may physically connect the first non-display area NA1 with the third non-display area NA3, and may be positioned at the other side of the first direction DR1 of the first bending line BL1 and one side of the second direction DR2 of the third bending line BL3 and surrounded by the first bending line BL1, the third bending line BL3 and corners at the other side of the first direction DR1 and one side of the second direction DR2 of the display panel 100.

The sixth non-display area NA6 may physically connect the second non-display area NA2 with the third non-display area NA3, and may be disposed at one side of the first direction DR1 of the second bending line BL2 and one side of the second direction DR2 of the third bending line BL3 and surrounded by the second bending line BL2, the third bending line BL3 and corners at one side of the first direction DR1 and one side of the second direction DR2 of the display panel 100.

The seventh non-display area NA7 may physically connect the first non-display area NA1 with the fourth non-display area NA4, and may be disposed at the other side of the first direction DR1 of the first bending line BL1 and the other side of the second direction DR2 of the fourth bending line BL4 and surrounded by the first bending line BL1, the fourth bending line BL4 and corners at the other side of the first direction DR1 and the other side of the second direction DR2 of the display panel 100.

The eighth non-display area NA8 may physically connect the second non-display area NA2 with the fourth non-display area NA4, and may be disposed at one side of the first direction DR1 of the second bending line BL2 and the other side of the second direction DR2 of the fourth bending line BL4 and surrounded by the second bending line BL2, the fourth bending line BL4 and corners at one side of the first direction DR1 and the other side of the second direction DR2 of the display panel 100.

Although not shown, a pad area to which an external signal is input may further be disposed at a short side of a lower side of the display panel 100. The pad area may be disposed at the other side of the second direction DR2 rather than the non-display area NA disposed at the short side of the lower side of the display panel 100. Signal lines extended form the display area DA may be disposed in the pad area, and may electrically be connected with external signal terminals, for example, a lead line of a printed circuit board when a chip on film is applied, or bumps of a driving chip when a chip on plastic is applied. Another bending lines may further be disposed between the pad area and the fourth non-display area NA4. These bending lines may be extended along the first direction DR1. Inorganic insulating layers of the display panel 100, which will be described later, may be removed from the area defined by these bending lines, and a via layer including an organic material may be disposed in the area defined by these bending lines.

Referring to FIG. 4, the printing layer 330 (refer to FIGS. 2 and 3A) of the window member 300 is disposed to overlap the non-display areas of the display panel 100. In FIG. 4, for convenience of description, the description will be given based on the corner portions at the other side of the first direction DR1 of the display panel 100 and one side of the second direction DR2 thereof. The following description may be applied to the other corner portions of the display panel 100.

The printing layer 330 may include an outer profile 330a adjacent to that of the display panel 100, and an inner profile 330b adjacent to the display areas DA1, DA2 and DA4 of the display panel 100. The outer profile 330a may overlap the outer profile of the display panel 100 in a thickness direction, and the inner profile 330b may overlap boundaries between the display areas DA1, DA2 and DA4 and the non-display areas NA1, NA3 and NA5 in a thickness direction.

The outer profile 330a of the printing layer 330 may include a (1-1)th portion 330a1 overlapped with an outer profile of the first non-display area NA1 and extended along the second direction DR2, a (1-2)th portion 330a2 overlapped with an outer profile of the third non-display area NA3 and extended along the first direction DR1, and a (1-3)th portion 330a3 mutually connecting the (1-1)th portion 330a1 with the (1-2)th portion 330a2, overlapped with an outer profile of the fifth non-display area NA5.

The inner profile 330b of the printing layer 330 may include a (2-1)th portion 330b1 overlapped with the inner profile of the first non-display area NA1 and extended along the second direction DR2, a (2-2)th portion 330b2 overlapped with an inner profile of the third non-display area NA3 and extended along the first direction DR1, and a (2-3)th portion 330b3 mutually connecting the (2-1)th portion 330b1 with the (2-2)th portion 330b2, overlapped with an inner profile of the fifth non-display area NA5.

Each of the (1-1)th portion 330a1 and the (2-1)th portion 330b1 of the printing layer 330 may have a straight line shape extended along the second direction DR2, and each of the (1-2)th portion 330a2 and the (2-2)th portion 330b2 may have a straight line shape extended along the first direction DR1.

Each of the (1-3)th portion 330a3 and the (2-3)th portion 330b3 of the printing layer 330 may have a partial curve shape having a predetermined curvature. The predetermined curvatures of the (1-3)th portion 330a3 and the (2-3)th portion 330b3 of the printing layer 330 may be different from each other but are not limited thereto. The same curvature may be applied to the (1-3)th portion 330a3 and the (2-3)th portion 330b3 of the printing layer 330.

Each of the (1-3)th portion 330a3 and the (2-3)th portion 330b3 of the printing layer 330 may be formed or provided with one curvature but may be formed or provided with a plurality of curvatures without being limited to one curvature.

The first bending line BL1 and the third bending line BL3 may be extended to cross the display area and the non-display area of the display device 1 such that at least a portion of the display area as well as the non-display area may be disposed at the side portions of the display device 1 as described above. To this end, the first bending line BL1 is disposed at one side of the first direction DR1 rather than the inner profile of the first non-display area NA1 of the display panel 100, and at the same time the third bending line BL3 is disposed at the other side of the second direction DR2 rather than the inner profile of the third non-display area NA3 of the display panel 100. At the same time, since the first bending intersection point DBP1 is disposed in the fifth non-display area NA5 as described above, the first bending intersection point DBP1 is disposed among an extension line of the inner profile of the first non-display area NA1, an extension line of the inner profile of the third non-display area NA3, and the (2-1)th printing layer 330b3 in the plan view as shown in FIG. 4.

Referring to FIGS. 5 and 6, edges of the display panel 100 may bent or curved by the first bending line BL1 and the third bending line BL3. That is, the first non-display area NA1 and the second display area DA2 may be bent toward the other side of the third direction DR3 through the first bending line BL1 to form the first side portion, and the third non-display area NA3 and the fourth display area DA4 may be bent toward the other side of the third direction DR3 through the third bending line BL3 to form the third side portion. Moreover, the fifth non-display area NA5 may be bent toward the other side of the third direction DR3 through the first bending line BL1 and the third bending line BL3 to form the fifth side portion.

Since a size of the fifth non-display area NA5 after bending becomes smaller than that of the fifth non-display area NA5 before bending, as shown in the enlarged view of FIG. 6, the fifth non-display area NA5 may partially be protruded toward the outside of the display panel 100, and may have an uneven shape recessed toward the inner side. For this reason, a bending stress applied to the fifth non-display area NA5 during bending may be greater than that applied to another adjacent area.

In addition, since the display panel 100 is simultaneously bent in the first bending intersection point DBP1 by two bending lines BL1 and BL3 crossing each other, a bending stress in the first bending intersection point DBP1 may be greater than that applied to the area bent by one bending line. Particularly, the bending stress applied to the corresponding area in which the first bending intersection point DBP1 is disposed may cause a crack in the fifth non-display area NA5. Moreover, the crack generated in the fifth non-display area NA5 is propagated to areas adjacent to the fifth non-display area, for example, the first display area DA1, the second display area DA2, the fourth display area DA4, the first non-display area NA1 and the third non-display area NA3, whereby a defect of the display device 1 is caused.

However, the display panel 100 in an embodiment may include a crack propagation prevention pattern (refer to 'CPP' of FIG. 7) disposed in the first bending intersection point DBP1 to prevent cracks generated in the fifth non-display area NA5 from being propagated within the fifth non-display area NA5 or from being propagated to areas adjacent to the fifth non-display area NA5.

Figure 7:
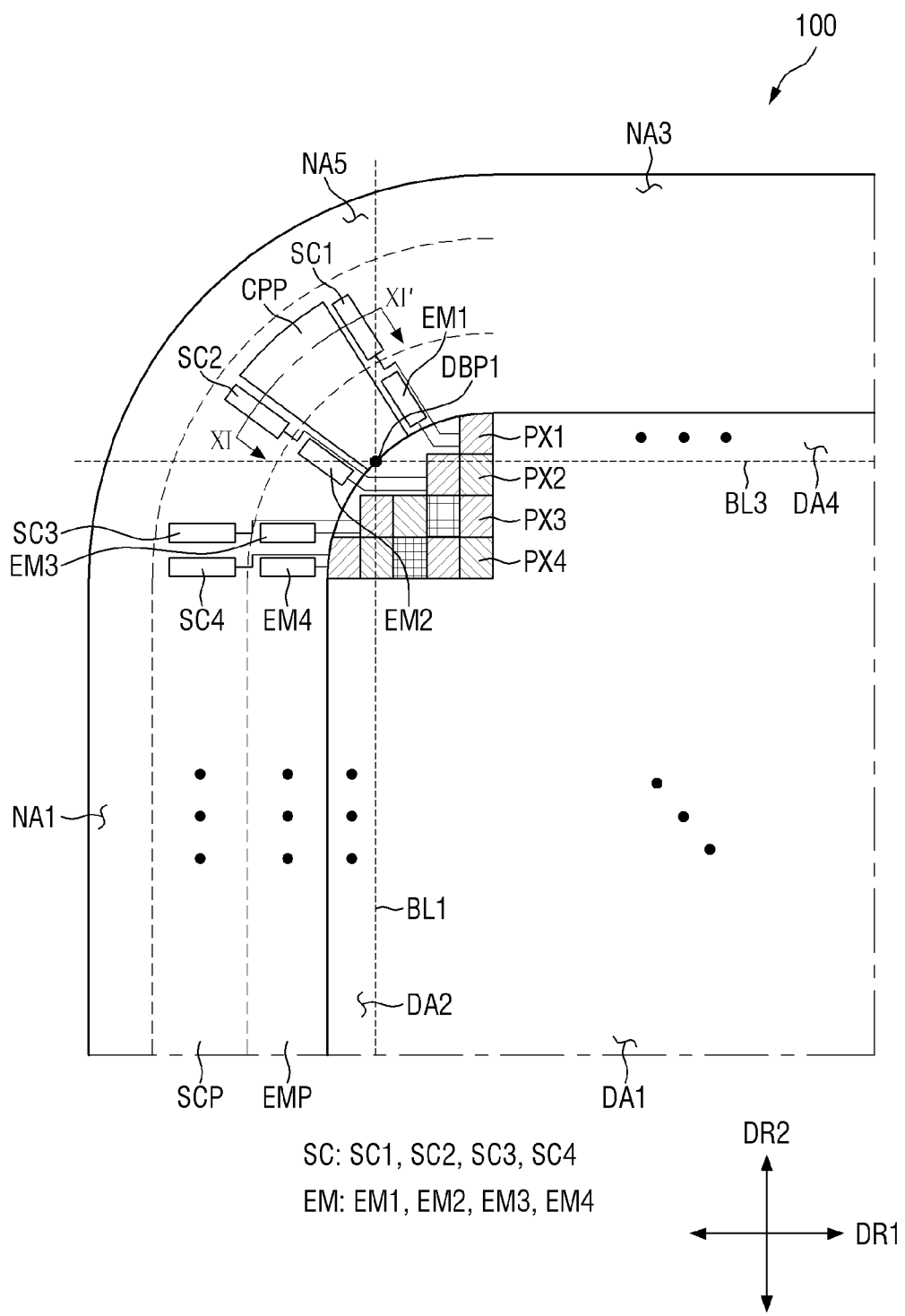
FIG. 7 is a partially enlarged plan view illustrating an embodiment of a display panel.
Figure 8:
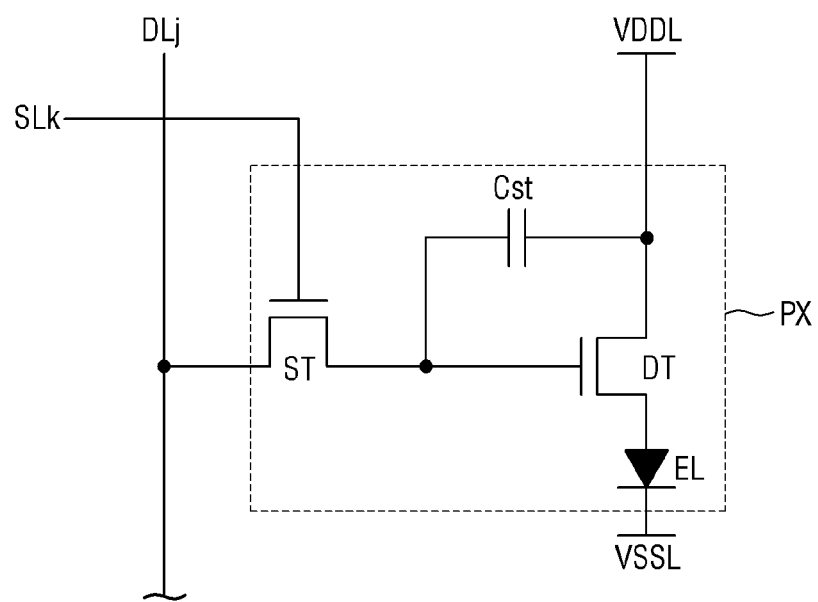
FIG. 8 is a circuit view illustrating an embodiment of a pixel of a display panel.
Figure 9:
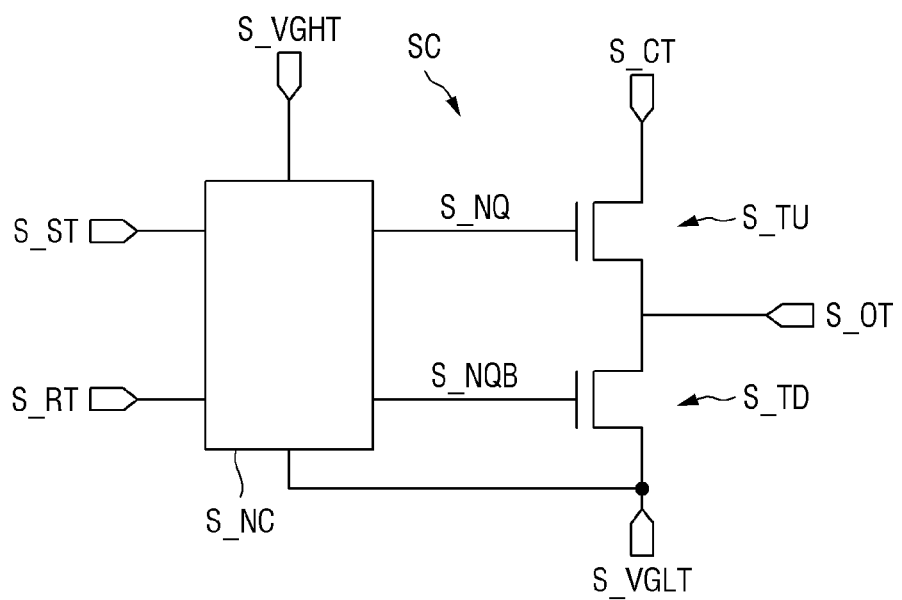
FIG. 9 is a circuit view illustrating an embodiment of a scan driving circuit of a display panel.
Figure 10:
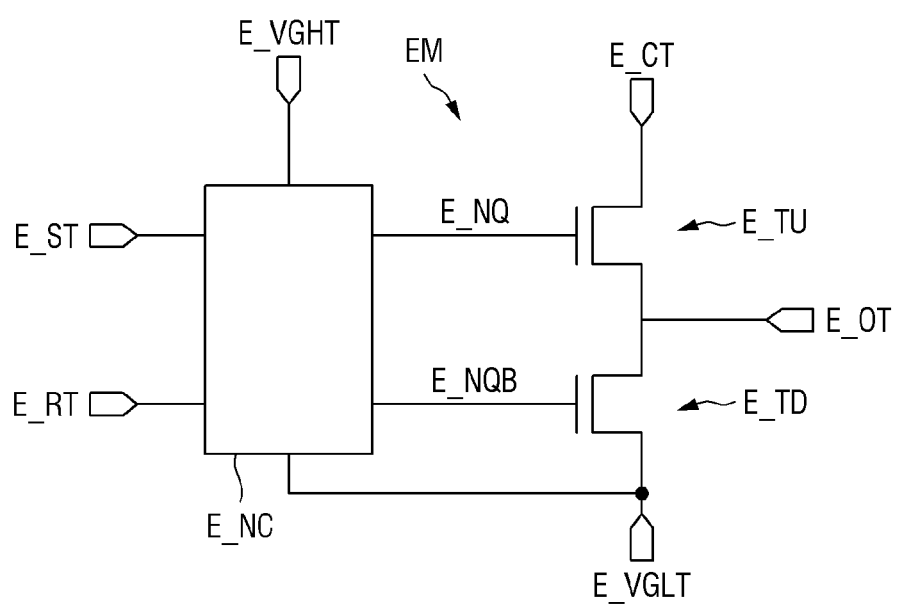
FIG. 10 is a circuit view illustrating an embodiment of an emission control driving circuit of a display panel.
Figure 11:
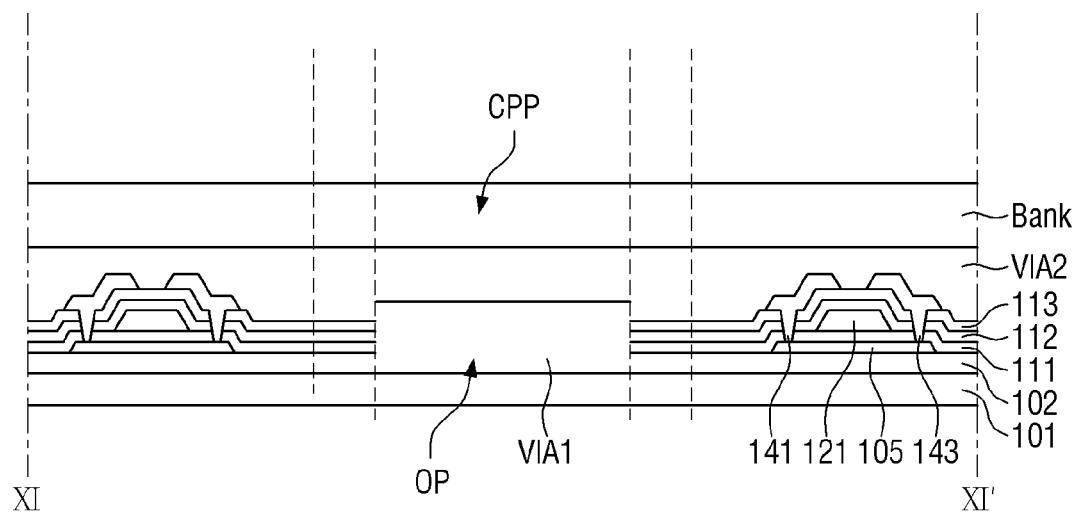
FIG. 11 is a cross-sectional view taken along line XI-XI' of FIG. 7.
Figure 12:
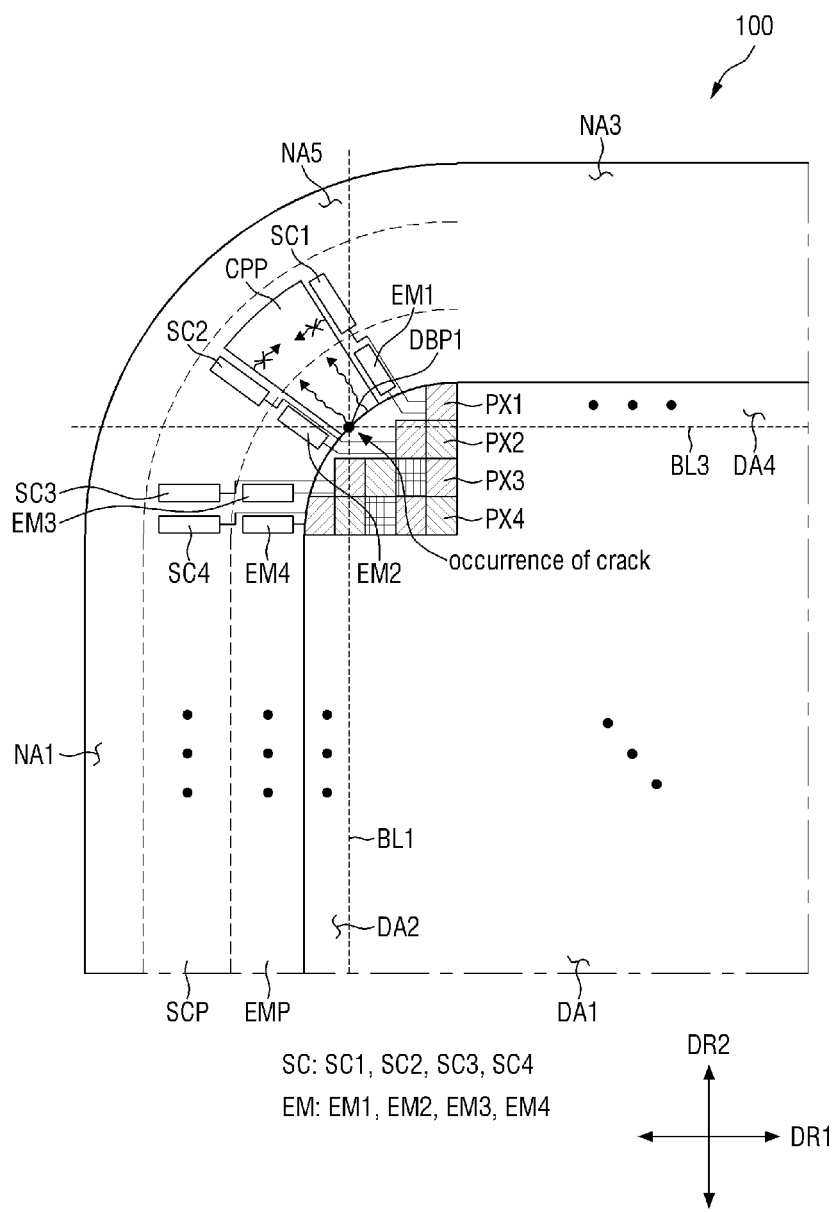
FIG. 12 is a plan view illustrating that an embodiment of a crack propagation prevention pattern of a display panel prevents a generated crack from being propagated.

FIG. 7 is a partially enlarged plan view illustrating an embodiment of a display panel, FIG. 8 is a circuit view illustrating an embodiment of a switching transistor of a pixel of a display panel, FIG. 9 is a circuit view illustrating an embodiment of a scan driving circuit of a display panel, FIG. 10 is a circuit view illustrating an embodiment of an emission control driving circuit of a display panel, FIG. 11 is a cross-sectional view taken along line XI-XI' of FIG. 7, and FIG. 12 is a plan view illustrating that a crack propagation prevention pattern of an embodiment of a display panel prevents a generated crack from being propagated. In FIGS. 7 and 12, for convenience of description, the description will be given based on the corner portions at the other side of the first direction DR1 of the display panel 100 and one side of the second direction DR2 thereof. It will be apparent that the following description may be applied to the other corner portions. Also, a switching transistor ST of FIG. 8 is illustrated in FIG. 11.

Referring to FIGS. 7 to 12, the display areas DA1, DA2 and DA4 of the display panel 100 may include a plurality of pixel rows PX1, PX2, PX3 and PX4. The pixel rows PX1, PX2, PX3 and PX4 may be extended along the first direction DR1. The pixel rows PX1, PX2, PX3 and PX4 may include pixels that emit their respective colors different from one another. In an embodiment, each of the pixel rows PX1, PX2, PX3 and PX4 may include at least one of a red pixel, green pixel and a blue pixel, for example. The red pixel, the green pixel and the blue pixel may repeatedly be disposed along the pixel rows. In some embodiments, at least one of the pixel rows PX1, PX2, PX3 and PX4 may further include a white pixel.

The pixels PX of the display areas DA1, DA2 and DA4 may be removed along the outer profiles of the display areas DA1, DA2 and DA4 as shown in FIG. 7, and thus may be disposed in a stepwise shape. That is, the number of the pixels PX disposed at the edges of the display areas DA1, DA2 and DA4 may generally be increased toward the fourth display area DA4, the first display area DA1 and the second display area DA2.

The pixel PX may include a driving transistor DT, at least one switching transistor ST, a light emitting diode EL, and a capacitor Cst. Since the switching transistor ST is turned on when a scan signal is applied from a kth (k is a positive integer) scan line SLk, a data voltage of a jth (j is a positive integer) data line DLj may be applied to a gate electrode of the driving transistor DT. A gate electrode of the switching transistor ST may be connected to the kth scan line SLk, a source electrode of the switching transistor ST may be connected to the gate electrode of the driving transistor DT, and a drain electrode of the switching transistor ST may be connected to the jth data line DLj.

The driving transistor DT may emit light by supplying a driving current to the light emitting diode in accordance with the data voltage applied to the gate electrode. The gate electrode of the driving transistor DT may be connected to the drain electrode of the switching transistor ST when the switching transistor ST is turned-on, a source electrode of the driving transistor DT may be connected to a first electrode of the light emitting diode EL and a drain electrode of the driving transistor DT may be connected to a first power line VDDL to which a first power voltage is applied.

The driving transistor DT and at least one switching transistor ST may be thin film transistors ("TFTs"). Also, although FIG. 8 illustrates that the driving transistor DT and at least one switching transistor ST include N type semiconductor transistors having N type semiconductor characteristics, the invention is not limited thereto. That is, the driving transistor DT and at least one switching transistor ST may include P type semiconductor transistors having P type semiconductor characteristics.

The light emitting diode EL may emit light in accordance with the driving current of the driving transistor DT. The light emitting diode EL may be an organic light emitting diode that includes a first electrode, an organic light emitting layer and a second electrode. The first electrode of the light emitting diode EL may be connected to the drain electrode of the driving transistor DT, and its second electrode may be connected to a second power line VSSL to which a second power voltage lower than the first power voltage is applied.

The capacitor Cst may be connected between the gate electrode and the source electrode of the driving transistor DT. For this reason, the capacitor Cst may serve to uniformly maintain the data voltage applied to the gate electrode of the driving transistor DT.

The non-display areas NA1 and NA5 of the display panel 100 may include a light emission control driving circuit portion EMP disposed to be adjacent to the first display area DA1, and a scan driving circuit portion SCP disposed to be spaced apart from the first display area DA1 by interposing the light emission control driving circuit portion EMP.

Although FIG. 7 shows that the light emission control driving circuit portion EMP and the scan driving circuit portion SCP are disposed in the first and fifth non-display areas NA1 and NA5 of the display panel 100, without limitation to this example, the light emission control driving circuit portion EMP and the scan driving circuit portion SCP may further be disposed in the second and sixth non-display areas NA2 and NA6. Moreover, the light emission control driving circuit portion EMP and the scan driving circuit portion SCP may further be disposed in a portion of the third non-display area NA3 adjacent thereto.

The scan driving circuit portion SCP includes a plurality of stages SC, e.g., SC1 to SC4. The plurality of stages SC1 to SC4 are respectively connected to scan lines of the respective pixel rows PX1, PX2, PX3 and PX4 and output scan signals to the scan lines. That is, the first stage SC1 may be connected with the first pixel row PX1, the second stage SC2 may be connected with the second pixel row PX2, the third stage SC3 may be connected with the third pixel row PX3, and the fourth stage SC4 may be connected with the fourth pixel row PX4. Although FIG. 7 shows that the first stage SC1 and the second stage SC2 are only disposed in the fifth non-display area NA5, without limitation to this example, three or more stages may be disposed in the fifth non-display area NA5.

Each of the stages SC1 to SC4, as shown in FIG. 9, includes a pull-up node S_NQ, a pull-down node S_NQB, a pull-up transistor S_TU turned on when the pull-up node S_NQ has a gate-on voltage, a pull-down transistor S_TD turned on when the pull-down node S_NQB has a gate-on voltage, and a node controller S_NC for controlling charge and discharge of the pull-up node S_NQ and the pull-down node S_NQB.

The node controller S_NC may be connected to a start terminal S_ST to which a start signal or an output signal of a front stage is input, a reset terminal S_RT to which an output signal of a rear stage is input, a gate-on voltage terminal S_VGHT to which a gate-on voltage is applied, and a gate-off voltage terminal S_VGLT to which a gate-off voltage is applied. The node controller S_NC controls charge and discharge of the pull-up node S_NQ and the pull-down node S_NQB in accordance with the start signal or the output signal of the front stage, which is input to the start terminal S_ST. The node controller S_NC allows the pull-down node S_NQB to have a gate-off voltage when the pull-up node S_NQ has a gate-on voltage and allows the pull-up node S_NQ to have a gate-off voltage when the pull-down node S_NQB has a gate-on voltage, thereby stably controlling the outputs of the stages SC1 to SC4. To this end, the node controller S_NC may include a plurality of transistors.

The pull-up transistor S_TU is turned on when the stages SC1 to SC4 are pulled-up, that is, when the pull-up node S_NQ has a gate-on voltage, and thus outputs a clock signal input to a clock terminal S_CT to an output terminal S_OT. The pull-down transistor S_TD is turned on when the stages SC1 to SC4 are pulled-down, for example, when the pull-down node S_NQB has a gate-on voltage, and thus outputs a gate-off voltage of a gate-off voltage terminal S_VGLT to the output terminal S_OT.

A plurality of transistors of the pull-up transistor S_TU, the pull-down transistor S_TD and the node controller S_NC of the stages SC1 to SC4 may include TFTs.

The light emission control driving circuit portion EMP includes a plurality of stages EM, e.g., EM1 to EM4. The plurality of stages EM1 to EM4 is respectively connected to the light emission control lines of the pixel rows PX1, PX2, PX3 and PX4, and output light emission control signals to the light emission control lines.

That is, the first stage EM1 may be connected to the first pixel row PX1, the second stage EM2 may be connected to the second pixel row PX2, the third stage EM3 may be connected to the third pixel row PX3, and the fourth stage EM4 may be connected to the fourth pixel row PX4. Although FIG. 7 shows that the first stage EM1 and the second stage EM2 are only disposed in the fifth non-display area NA5, without limitation to this example, three or more stages may be disposed in the fifth non-display area NA5.

Each of the stages EM, e.g., EM1 to EM4, as shown in FIG. 10, includes a pull-up node E_NQ, a pull-down node E_NQB, a pull-up transistor E_TU turned on when the pull-up node E_NQ has a gate-on voltage, and thus outputting a clock signal input to a clock terminal E_CT to an output terminal E_OT, a pull-down transistor E_TD turned on when the pull-down node E_NQB has a gate-on voltage and thus outputting a gate-off voltage of a gate-off voltage terminal E_VGLT to the output terminal E_OT, and a node controller E_NC for controlling charge and discharge of the pull-up node E_NQ and the pull-down node E_NQB. A start terminal E_ST, a reset terminal E_RT, a gate-on voltage terminal E_VGHT of the plurality of stages EM may be similar to the start terminal S_ST, the reset terminal S_RT, and the gate-on voltage terminal S_VGHT of the plurality of stages SC, and therefore a detailed description may be omitted.

The plurality of stages EM1 to EM4 of the light emission control driving circuit portion EMP may substantially operate in the same manner as the plurality of stages SC1 to SC4 of the scan driving circuit portion SCP, and thus their detailed description will be omitted.

The plurality of stages EM1 to EM4 of the light emission control driving circuit portion EMP and the plurality of stages SC1 to SC4 of the scan driving circuit portion SCP may generally be aligned and arranged in a direction oriented toward the pixels PX. That is, the first stage EM1 of the light emission control driving circuit portion EMP and the first stage SC1 of the scan driving circuit portion SCP may be aligned with each other, the second stage EM2 of the light emission control driving circuit portion EMP and the second stage SC2 of the scan driving circuit portion SCP may be aligned with each other, the third stage EM3 of the light emission control driving circuit portion EMP and the third stage SC3 of the scan driving circuit portion SCP may be aligned with each other, and the fourth stage EM4 of the light emission control driving circuit portion EMP and the fourth stage SC4 of the scan driving circuit portion SCP may be aligned with each other.

Since the curve shape is applied to the corner portions of the fifth non-display area NA5 of the display panel 100 in an embodiment as described above, an interval based on the profile extension direction of the display panel 100 between the mutually aligned stages of the light emission control driving circuit portion EMP and the scan driving circuit portion SCP disposed in the fifth non-display area NA5 may be greater than that based on the profile extension direction between the mutually aligned stages of the light emission control driving circuit portion EMP and the scan driving circuit portion SCP disposed in the first non-display area NA1. That is, the interval between the first stage EM1 of the light emission control driving circuit portion EMP and the second stage EM2 of the light emission control driving circuit portion EMP may be greater than the interval between the third stage EM3 of the light emission control driving circuit portion EMP and the fourth stage EM4 of the light emission control driving circuit portion EMP. Likewise, the interval between the first stage SC1 of the scan driving circuit portion SCP and the second stage SC2 of the scan driving circuit portion SCP may be greater than the interval between the third stage SC3 of the scan driving circuit portion SCP and the fourth stage SC4 of the scan driving circuit portion SCP.

Moreover, the interval between the second stage EM2 of the light emission control driving circuit portion EMP and the third stage EM3 of the light emission control driving circuit portion EMP may be greater than the interval between the third stage EM3 of the light emission control driving circuit portion EMP and the fourth stage EM4 of the light emission control driving circuit portion EMP, and the interval between the second stage SC2 of the scan driving circuit portion SCP and the third stage SC3 of the scan driving circuit portion SCP may be greater than the interval between the third stage SC3 of the scan driving circuit portion SCP and the fourth stage SC4 of the scan driving circuit portion SCP.

The crack propagation prevention pattern CPP may further be disposed in the space where the first stage EM1 of the light emission control driving circuit portion EMP is spaced apart from the second stage EM2 of the light emission control driving circuit portion EMP and the space where the first stage SC1 of the scan driving circuit portion SCP is spaced apart from the second stage SC2 of the scan driving circuit portion SCP. The crack propagation prevention pattern CPP may include an organic material.

As the first bending intersection point DBP1 is disposed in the crack propagation prevention pattern CPP, cracks generated due to dual bending may be absorbed by the crack propagation prevention pattern CPP or propagation to at least adjacent area may be attenuated.

Referring to FIG. 11, the display panel 100 may include a flexible substrate 101, a plurality of conductive layers, and a plurality of organic/inorganic insulating layers insulating the plurality of conductive layers from one another. The organic insulating layer of the display panel 100 may include a first via layer, a second via layer, and a bank layer. An open portion OP may be defined in the plurality of organic insulating layers, which will be described later, in an area overlapped with the crack propagation prevention pattern CPP.

The flexible substrate 101 is fully disposed over the display area DA and the non-display area NA. The flexible substrate 101 may serve to support various elements disposed thereabove. In an embodiment, the flexible substrate 101 may be a flexible substrate that includes a flexible material such as polyimide ("PI").

A buffer layer 102 may be disposed on the flexible substrate 101. The buffer layer 102 may serve to prevent external water and oxygen from being permeated through the flexible substrate 101. In an embodiment, the buffer layer 102 may include any one of a silicon nitride (SiNx) film, a silicon oxide ($SiO_2$) film, and a silicon oxynitride (SiOxNy) film.

A semiconductor layer 105 may be disposed on the buffer layer 102. The semiconductor layer 105 form a channel of the switching transistor ST. The semiconductor layer 105 may include a source/drain area and an active area. The semiconductor layer 105 may include, but is not limited to, a polycrystalline silicon. The semiconductor layer 105 may include an oxide semiconductor.

A first insulating layer 111 may be disposed on the semiconductor layer 105. The first insulating layer 111 may be a gate insulating film having a gate insulating function. In an embodiment, the first insulating layer 111 may include a silicon compound, a metal oxide, etc. In an embodiment, the first insulating layer 111 may include a silicon oxide, a silicon nitride, a silicon oxynitride, an aluminum oxide, a tantalum oxide, a hafnium oxide, a zirconium oxide, and a titanium oxide, for example. These oxides may be used alone or by combination.

A first conductive layer may be disposed on the first insulating layer 111. The first conductive layer may include gate electrodes 121. Although not shown, a first electrode of a capacitor (also referred to as a sustain capacitor) Cst (refer to FIG. 8) may further be disposed in the same layer as the gate electrode 121. The gate electrode 121 may constitute a gate electrode of the switching transistor ST. The gate electrode 121 may include one or more metals selected from Mo, Al, Pt, Pd, Ag, Mg, Au, Ni, Nd, Ir, Cr, Ca, Ti, Ta, W, and Cu. The first conductive layer may be a single film or a deposited film including the above material(s).

A second insulating layer 112 may be disposed on the gate electrode 121. The second insulating layer 112 may insulate the gate electrode 121 from source/drain electrodes 141 and 143.

Although not shown, a second conductive layer that includes a second electrode of the sustain capacitor Cst may be disposed on the second insulating layer 112. A material of the second conductive layer may be selected from the above-exemplified materials of the gate electrode 121. The first electrode of the sustain capacitor Cst and the second electrode of the sustain capacitor Cst may form the capacitor through the second insulating layer 112.

A third insulating layer 113 may be disposed on the second electrode of the sustain capacitor Cst. The third insulating layer 113 may include at least one of the above-exemplified materials of the first insulating layer 111. In some embodiments, the third insulating layer 113 may include an organic insulating material. The organic insulating material may be selected from exemplified materials of a first via layer VIA1, which will be described later.

A third conductive layer that includes the source/drain electrodes 141 and 143 may be disposed on the third insulating layer 113. In an embodiment, the source/drain electrodes 141 and 143 may include at least one of Mo, Al, Pt, Pd, Ag, Mg, Au, Ni, Nd, Ir, Cr, Ca, Ti, Ta, W, or Cu.

The source electrode 141 may electrically be in contact with the source area of the semiconductor layer 105 through contact holes of the first to third insulating layers 111 to 113, and the drain electrode 143 may electrically be in contact with the drain area of the semiconductor layer 105 through the contact holes of the first to third insulating layers 111 to 113. Although not shown, the third conductive layer may further include a high potential voltage electrode.

A second via layer VIA2 may be disposed on the source/drain electrodes 141 and 143. The second via layer VIA2 may include an organic insulating material. In an embodiment, the organic insulating material may include at least one of polyacrylate resin, epoxy resin, phenolic resin, polyamides resin, polyimides resin, unsaturated polyesters resin, poly phenylenethers resin, polyphenylenesulfides resin or benzocyclobutene ("BCB").

Although not shown, a fourth conductive layer may be disposed on the second via layer VIA2. The fourth conductive layer may include a data line, a connection electrode, and a high potential voltage line. The data line may electrically be connected with the source electrode 141 of the switching transistor ST through a contact hole that passes through the second via layer VIA2. The connection electrode may electrically be connected with the drain electrode 143 of the switching transistor ST through the contact hole that passes through the second via layer VIA2. The high potential voltage line may electrically be connected with the high potential voltage electrode through the contact hole that passes through the second via layer VIA2. The fourth conductive layer may include the material selected from the exemplified materials of the third conductive layer.

Although not shown, a third via layer is disposed on the fourth conductive layer. The third via layer may include at least one of the exemplified materials of the second via layer VIA2.

Although not shown, an anode electrode is disposed on the third via layer. The anode electrode may electrically be connected with the connection electrode through a contact hole that passes through the third via layer.

A bank layer BANK may be disposed on the anode electrode. A contact hole that exposes the anode electrode may be defined in the bank layer BANK. The bank layer BANK may include an organic insulating material. In an embodiment, the bank layer BANK may include at least one of a photoresist, a polyimide resin, an acrylic resin, a silicon compound or a polyacrylic resin, for example.

An organic layer may be disposed on an upper surface of the anode electrode and in an open portion of the bank layer BANK. A cathode electrode is disposed on the organic layer and the bank layer BANK. The cathode electrode may be a common electrode disposed over the plurality of pixels. The encapsulation film is disposed on the cathode electrode.

An open portion OP where the buffer layer 102 and the first to third insulating layers 111 to 113 expose the upper surface of the flexible substrate 101 in the fifth non-display area NA may be defined in the display panel 100, and the crack propagation prevention pattern CPP may be disposed in the open portion OP. The open portion OP may be disposed in a gap space between the first and second stages SC1 and SC2 (refer to FIG. 7) of the scan driving circuit portion SCP, which are adjacent to each other in the plan view and a gap space between the first and second stages EM1 and EM2 of the light emission control driving circuit portion EMP, which are adjacent to each other. The crack propagation prevention pattern CPP may directly contact the exposed upper surface of the flexible substrate 101. The crack propagation prevention pattern CPP may include a first via layer VIA1. The first via layer VIA1 may be formed or provided through the same process as that of the via layer disposed in the area defined by the above another bending lines of the display panel 100. The first via layer VIA1 may include at least one of the exemplified materials of the second via layer VIA2. The first via layer VIA1 may directly contact the upper surface of the flexible substrate 101.

The crack propagation prevention pattern CPP may further include a second via layer VIA2 disposed on the first via layer VIA1 and disposed in the open portion OP, and a bank layer BANK disposed on the second via layer VIA2 and disposed in the open portion OP.

The first via layer VIA1 may contact the exposed sides of the inorganic insulating layers adjacent thereto. In an embodiment, the first via layer VIA1 may contact the exposed sides of the buffer layer 102 and the first to third insulating layers 111 to 113, for example.

The first bending intersection point DBP1 may be disposed in the crack propagation prevention pattern CPP in the plan view.

As shown in FIG. 12, the crack propagation prevention pattern CPP may be disposed in the open portion OP where the inorganic insulating layers of the display panel 100 are exposed, and includes an organic material, whereby a crack generated in the fifth non-display area NA5 having a high risk of occurrence of the crack, particularly the crack generated in the first bending intersection point DBP1 may be prevented from being propagated to the area adjacent to the fifth non-display area NA5.

Particularly, as the crack propagation prevention pattern CPP may be disposed in the gap space between the first stage EM1 of the light emission control driving circuit portion EMP and the second stage EM2 of the light emission control driving circuit portion EMP and the gap space between the first stage SC1 of the scan driving circuit portion SCP and the second stage SC2 of the scan driving circuit portion SCP, in the plan view, even though the crack is generated in the first stage EM1 of the light emission control driving circuit portion EMP and the first stage SC1 of the scan driving circuit portion SCP, the generated crack is prevented from being propagated to the second stage EM2 of the light emission control driving circuit portion EMP and the second stage SC2 of the scan driving circuit portion SCP, which are adjacent to the first stage EM1 and the first stage SC1, whereby a defect of the display device 1 may be avoided in advance.

Hereinafter, another embodiments will be described. In the following embodiments, the same reference numerals will be given to the same elements as those described in the aforementioned embodiment, and their description will be omitted or briefly described.

Figure 13:
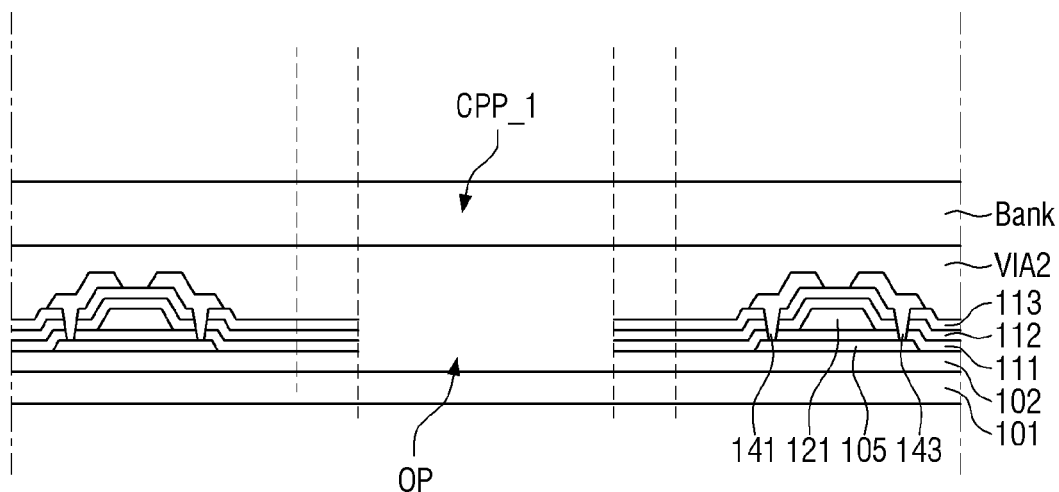
FIGS. 13 and 14 are cross-sectional views illustrating another embodiments of the embodiment according to FIG. 11.
Figure 14:
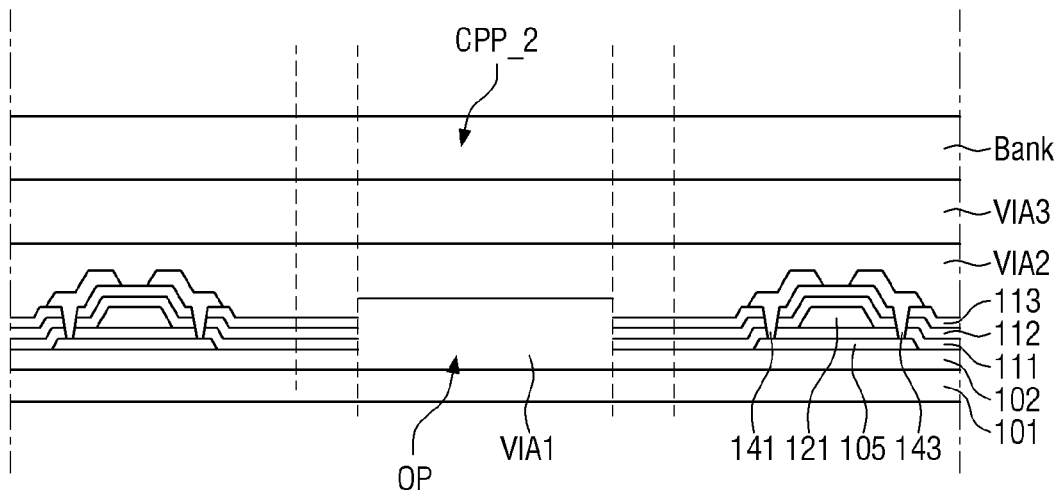

FIGS. 13 and 14 are cross-sectional views illustrating another embodiments of the embodiment according to FIG. 11. FIGS. 13 and 14 illustrate that various modifications may be made in the crack propagation prevention pattern CPP in an embodiment.

Referring to FIG. 13, a crack propagation prevention pattern CPP_1 according to this embodiment is different from the crack propagation prevention pattern of FIG. 11 in that it does not include the first via layer VIAL In more detail, the crack propagation prevention pattern CPP_1 may include a second via layer VIA2, and a bank layer BANK disposed on the second via layer VIA2.

The second via layer VIA2 may directly contact the upper surface of the flexible substrate 101. The second via layer VIA2 may contact the exposed sides of the inorganic insulating layers adjacent thereto. In an embodiment, the second via layer VIA2 may contact the exposed sides of the buffer layer 102 and the first to third insulating layers 111 to 113, for example.

The first bending intersection point DBP1 may be disposed inside the crack propagation prevention pattern CPP_1 in the plan view.

The crack propagation prevention pattern CPP_1 may be disposed in the open portion OP where the inorganic insulating layers of the display panel 100 are exposed, and may include an organic material, whereby a crack generated in the fifth non-display area NA5 having a high risk of occurrence of the crack, particularly the crack generated in the first bending intersection point DBP1 may be prevented from being propagated to the area adjacent to the fifth non-display area NA5.

Particularly, as the crack propagation prevention pattern CPP_1 may be disposed in the gap space between the first stage EM1 of the light emission control driving circuit portion EMP and the second stage EM1 of the light emission control driving circuit portion EMP and the gap space between the first stage SC1 of the scan driving circuit portion SCP and the second stage SC2 of the scan driving circuit portion SCP, in the plan view, even though the crack is generated in the first stage EM1 of the light emission control driving circuit portion EMP and the first stage SC1 of the scan driving circuit portion SCP, the generated crack is prevented from being propagated to the second stage EM2 of the light emission control driving circuit portion EMP and the second stage SC2 of the scan driving circuit portion SCP, which are adjacent to the first stage EM1 and the first stage SC1, whereby a defect of the display device 1 may be avoided in advance.

Referring to FIG. 14, a crack propagation prevention pattern CPP 2 according to this embodiment is different from the crack propagation prevention pattern CPP of FIG. 11 in that it further includes the third via layer VIA3 disposed between the second via layer VIA2 and the bank layer BANK.

Figure 15:
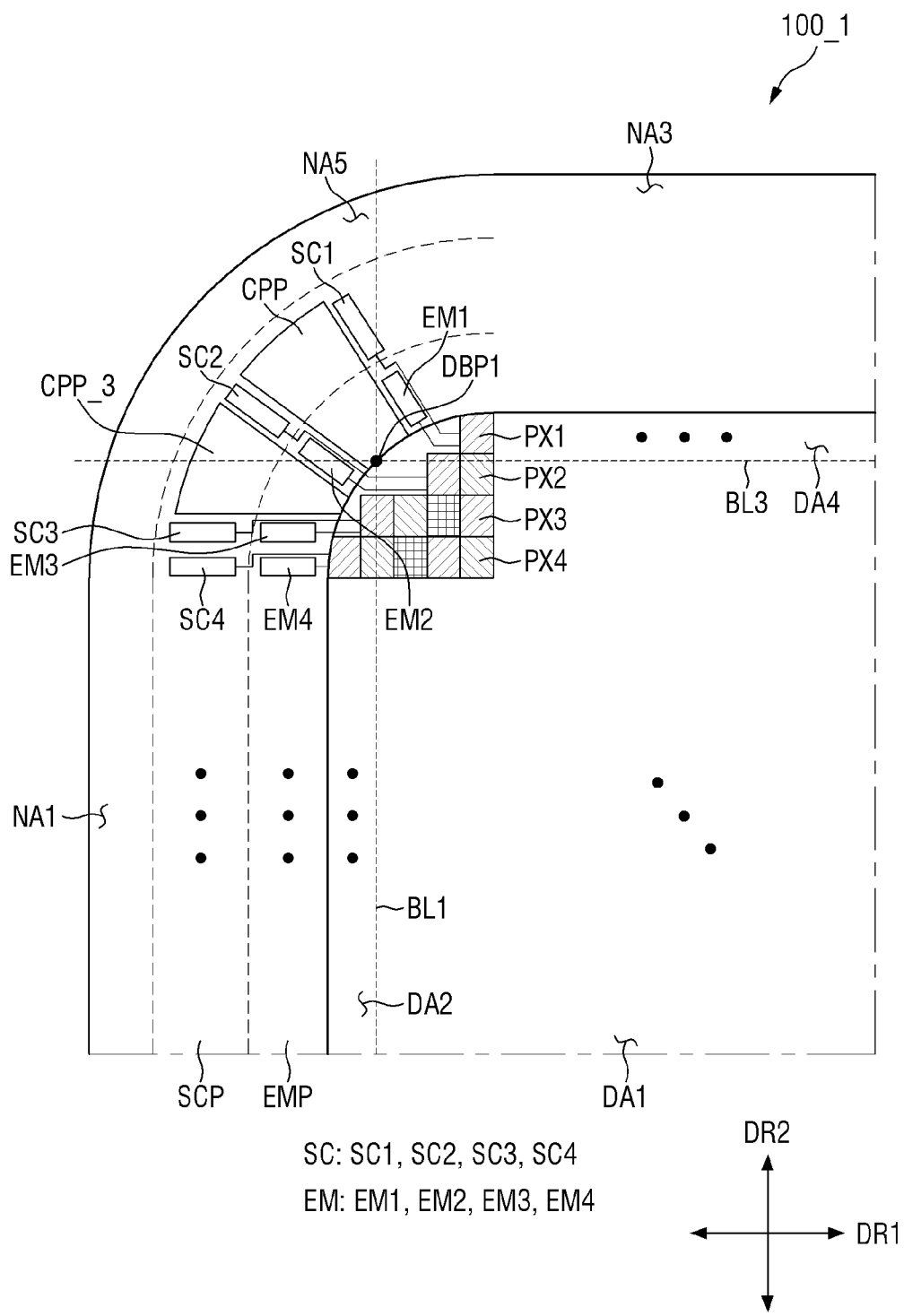
FIG. 15 is a partially enlarged plan view illustrating another embodiment of a display panel.

FIG. 15 is a partially enlarged plan view illustrating another embodiment of a display panel.

Referring to FIG. 15, a display panel 100_1 according to this embodiment is different from the display panel 100 of FIG. 7 in that it further includes a crack propagation prevention pattern CPP_3 disposed between the second stage SC2 and the third stage SC3 of the scan driving circuit portion SCP in the plan view.

In more detail, the crack propagation prevention pattern CPP_3 according to this embodiment may be disposed between the second stage SC2 and the third stage SC3 of the scan driving circuit portion SCP, and may also be disposed between the second stage EM2 and the third stage EM3 of the light emission control driving circuit portion EMP.

The crack propagation prevention pattern CPP_3 may be disposed over the fifth non-display area NA5 and the first non-display area NA1 of the display panel 100_1. A cross-sectional shape of the crack propagation prevention pattern CPP_3 may be any one of FIGS. 11, 13 and 14 illustrating cross-sectional shapes of the crack propagation prevention pattern CPP. The cross-sectional shape of the crack propagation prevention pattern CPP_3 may be the same as that of the crack propagation prevention pattern CPP.

In the display panel 100_1 according to this embodiment, the crack propagation prevention pattern CPP_3 may be disposed between the second stage SC2 and the third stage SC3 of the scan driving circuit portion SCP, and may also be disposed between the second stage EM2 and the third stage EM3 of the light emission control driving circuit portion EMP, whereby the crack generated in the fifth non-display area NA5 may be prevented from being propagated to the first non-display area NA1 adjacent to the fifth non-display area NA5 in advance.

Figure 16:
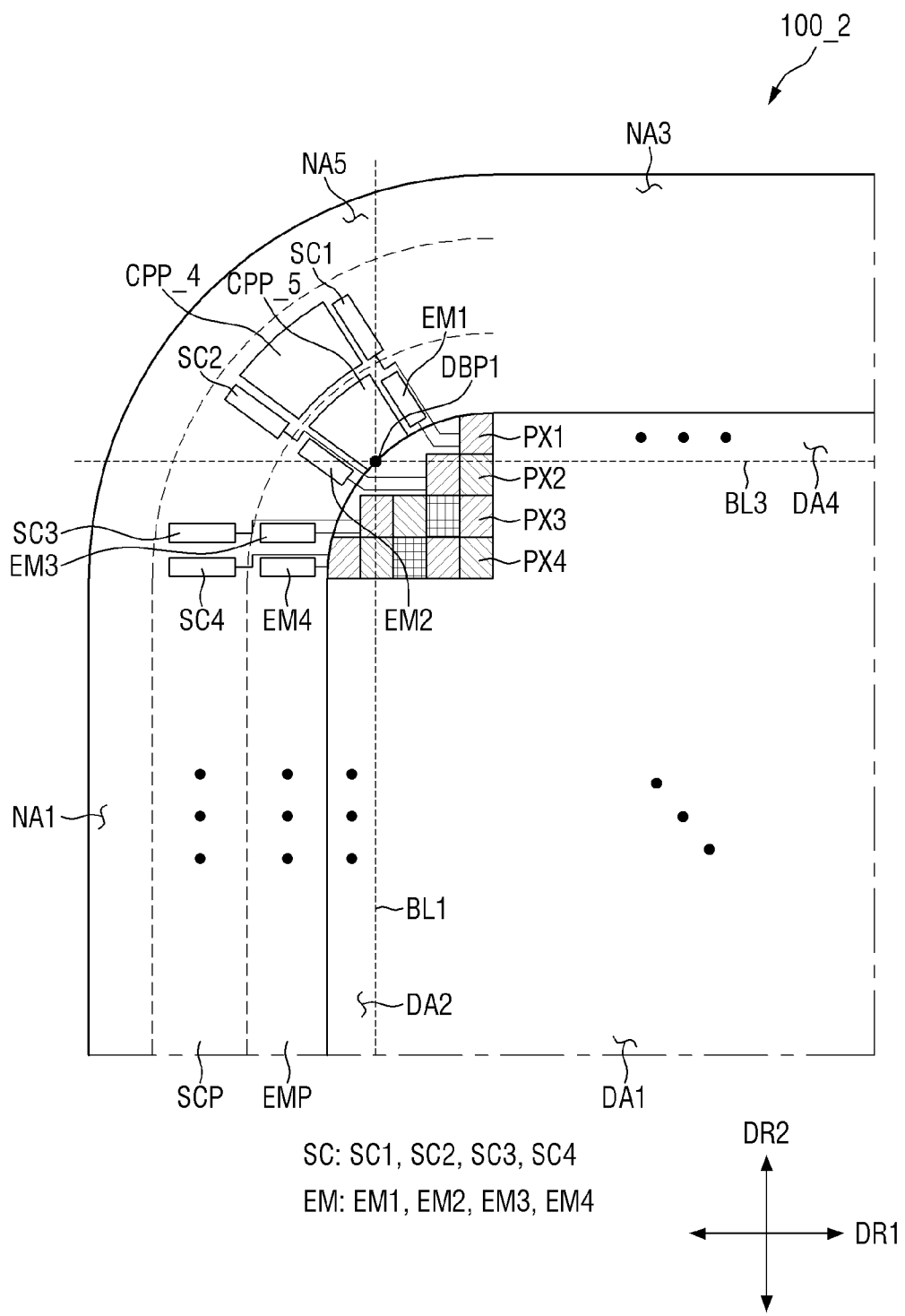
FIG. 16 is a partially enlarged plan view illustrating another embodiment of a display panel.

FIG. 16 is a partially enlarged plan view illustrating another embodiment of a display panel.

Referring to FIG. 16, crack propagation prevention patterns CPP_4 and CPP_5 of a display panel 100_2 according to this embodiment are different from the crack propagation prevention pattern CPP of FIG. 7 in that the crack propagation prevention patterns CPP_4 and CPP_5 are disposed to be spaced apart from each other.

In more detail, the crack propagation prevention patterns CPP_4 and CPP_5 according to this embodiment may be disposed to be spaced apart from each other in a direction oriented toward the first display area DA1. That is, the crack propagation prevention pattern CPP_4 may be disposed between the first stage SC1 and the second stage SC2 of the scan driving circuit portion SCP, and the crack propagation prevention pattern CPP_5 may be disposed between the first stage EM1 and the second stage EM2 of the light emission control driving circuit portion EMP.

Figure 17:
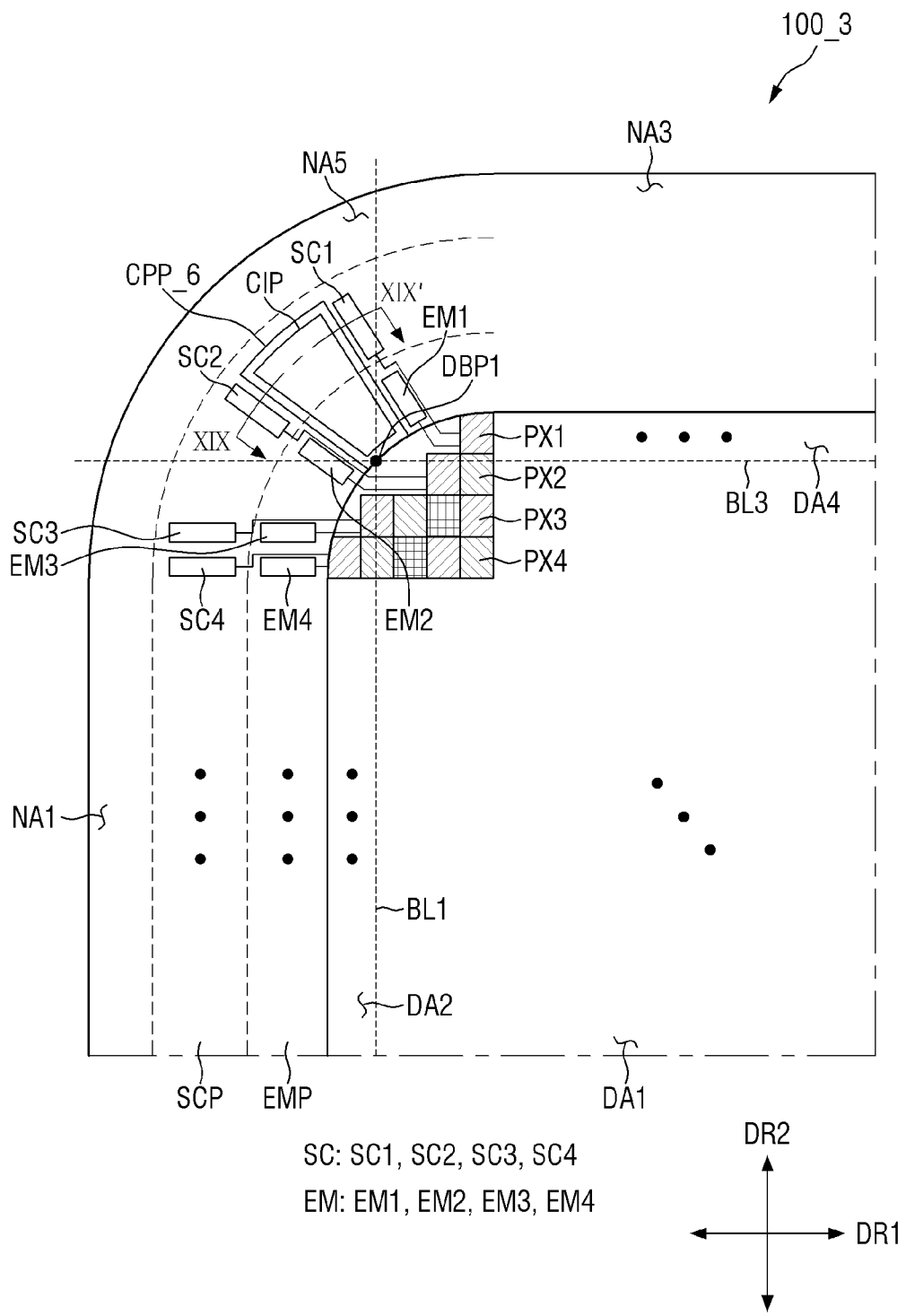
FIG. 17 is a partially enlarged plan view illustrating another embodiment of a display panel.
Figure 18:
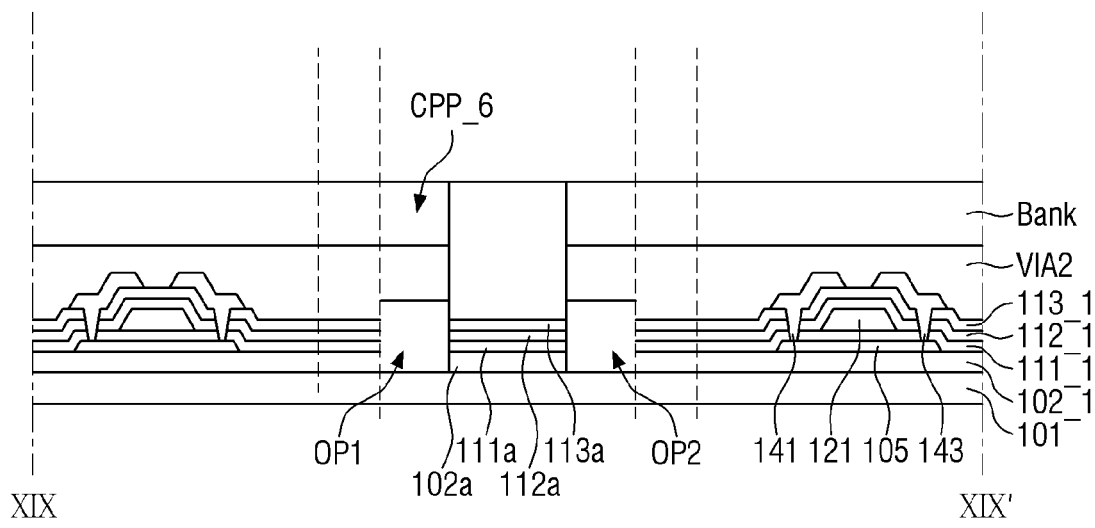
FIG. 18 is a cross-sectional view taken along line XIX-XIX' of FIG. 17.

FIG. 17 is a partially enlarged plan view illustrating another embodiment of a display panel, and FIG. 18 is a cross-sectional view taken along line XIX-XIX' of FIG. 17.

Referring to FIGS. 17 and 18, a display panel 100_3 according to this embodiment is different from the display panel 100 of FIG. 7 in that it further includes a crack induction pattern CIP inside a crack propagation prevention pattern CPP_6 in the plan view.

In more detail, in the display panel 100_3 according to this embodiment, the crack induction pattern CIP may further be disposed inside the crack propagation prevention pattern CPP_6. That is, at least a portion of the crack induction pattern CIP may be surrounded by the crack propagation prevention pattern CPP_6 in the plan view. In an embodiment, as shown in FIG. 17, the crack induction pattern CIP may be fully surrounded by the crack propagation prevention pattern CPP_6 in the plan view, for example.

The crack induction pattern CIP may include a plurality of inorganic insulating layers that are deposited, to induce a crack in the fifth non-display area NA5 having a high possibility of occurrence of the crack, and may serve to prevent the crack from being generated in the other areas except the area in which the crack induction pattern CIP is disposed. Moreover, the crack induction pattern CIP may be fully surrounded by the crack propagation prevention pattern CPP_6 in the plan view, whereby the cracks generated in the crack induction pattern CIP may be prevented from being propagated to a peripheral area of the crack induction pattern CIP in advance.

As shown in FIG. 18, the crack induction pattern CIP may be disposed in a plane space surrounded by a first open portion OP1 and a second open portion OP2 of the plurality of deposited inorganic insulating layers. A buffer layer 102_1 may include a sub buffer layer 102a between the first open portion OP1 and the second open portion OP2, a first insulating layer 111_1 may include a sub first insulating layer 111a between the first open portion OP1 and the second open portion OP2, a second insulating layer 112_1 may include a sub second insulating layer 112a between the first open portion OP1 and the second open portion OP2, and a third insulating layer 113_1 may include a sub third insulating layer 113a between the first open portion OP1 and the second open portion OP2. The sub buffer layer 102a, the sub first insulating layer 111a, the sub second insulating layer 112a and the sub third insulating layer 113a may constitute the crack induction pattern CIP. That is, the crack induction pattern CIP may include the sub buffer layer 102a, the sub first insulating layer 111a, the sub second insulating layer 112a, and the sub third insulating layer 113a.

The crack induction pattern CIP may not include an organic material. In the crack induction pattern CIP, the sub buffer layer 102a, the sub first insulating layer 111a, the sub second insulating layer 112a and the sub third insulating layer 113a may directly contact the exposed sides of the crack propagation prevention pattern CPP_6. In some embodiments, any one of the sub buffer layer 102a, the sub first insulating layer 111a, the sub second insulating layer 112a and the sub third insulating layer 113a may be removed or omitted.

Figure 19:
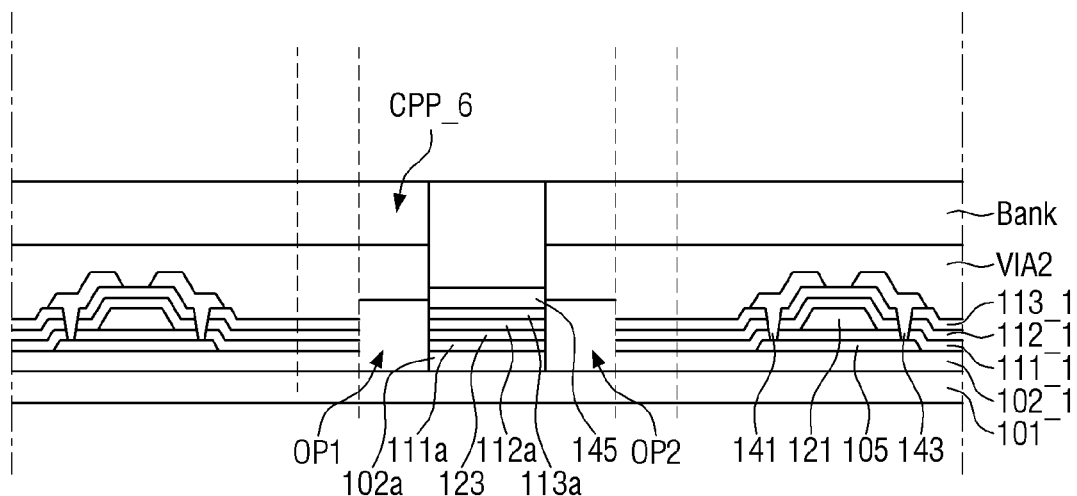
FIG. 19 is a cross-sectional view illustrating another embodiment of the embodiment according to FIG. 18.

FIG. 19 is a cross-sectional view illustrating another embodiment of the embodiment according to FIG. 18.

Referring to FIG. 19, a crack induction pattern CIPa is different from the crack induction pattern CIP of FIG. 18 in that it further includes a plurality of deposited conductive layers.

In more detail, the first conductive layer may further include a sub gate electrode 123, and the third conductive layer may further include a sub source/drain electrode 145. The sub gate electrode 123 may be disposed between the sub first insulating layer 111a and the sub second insulating layer 112a, and the sub source/drain electrode 145 may be disposed on the sub third insulating layer 113a.

In some embodiments, when the display panel further includes the second conductive layer as described above, the second conductive layer may further include a sub capacitor second electrode constituting the crack induction pattern CIPa, and the sub capacitor second electrode may further be disposed between the sub second insulating layer 112a and the sub third insulating layer 113a.

In some embodiments, when the display panel further includes the fourth conductive layer as described above, the fourth conductive layer may further include a sub connection electrode constituting the crack induction pattern CIPa, and the sub connection electrode may further be disposed on the sub source/drain electrode 145.

Figure 20:
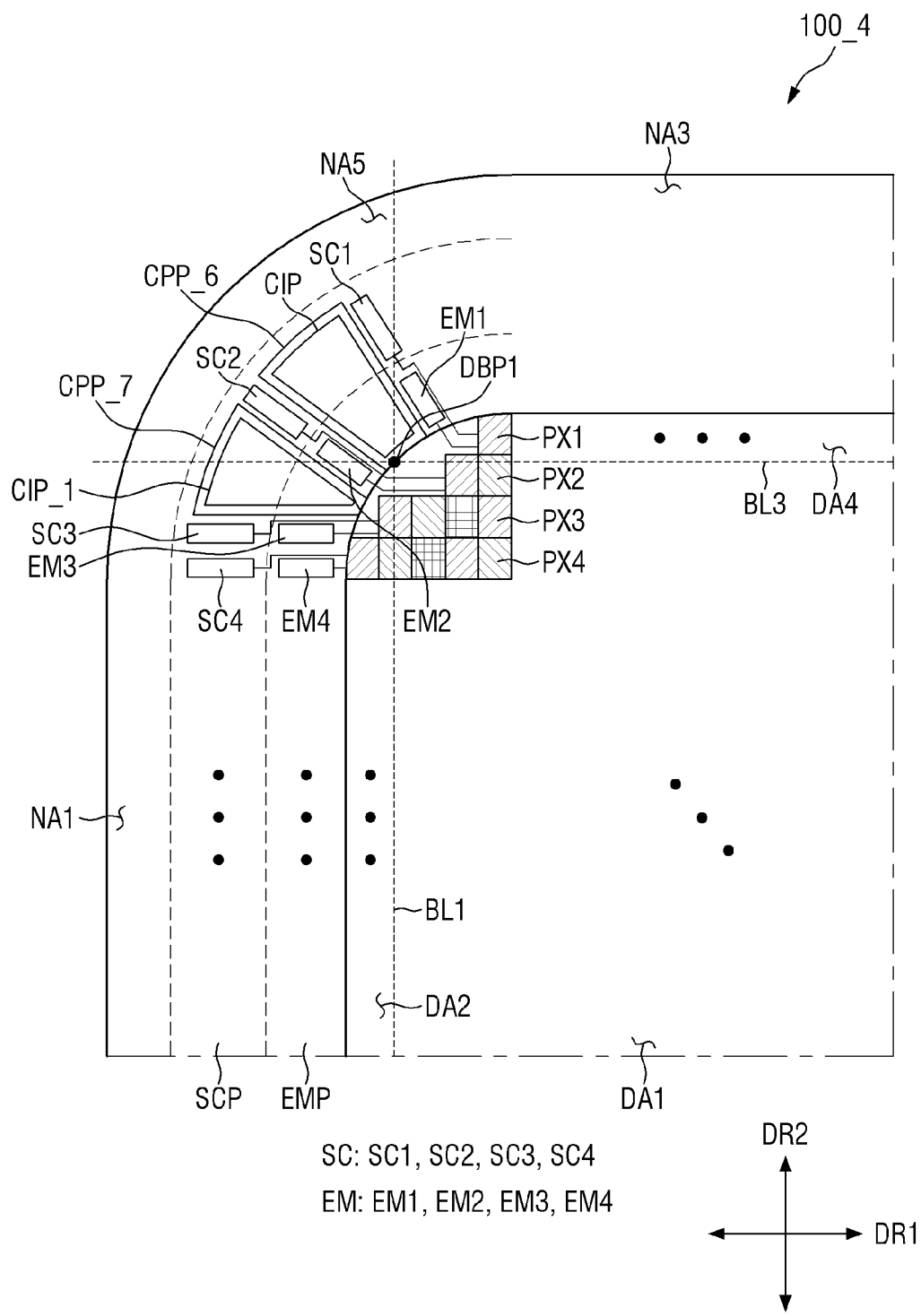
FIG. 20 is a partially enlarged plan view illustrating another embodiment of a display panel.

FIG. 20 is a partially enlarged plan view illustrating another embodiment of a display panel.

Referring to FIG. 20, a display panel 100_4 according to this embodiment is different from the display panel 100_3 of FIG. 17 in that it further includes a crack propagation prevention pattern CPP_7 disposed in the area, in which the crack propagation prevention pattern CPP_3 of FIG. 15 is disposed, in the same manner as the crack propagation prevent pattern CPP_3 of FIG. 15 and provided with a crack induction pattern CIP_1 disposed thereinside in the plan view.

Figure 21:
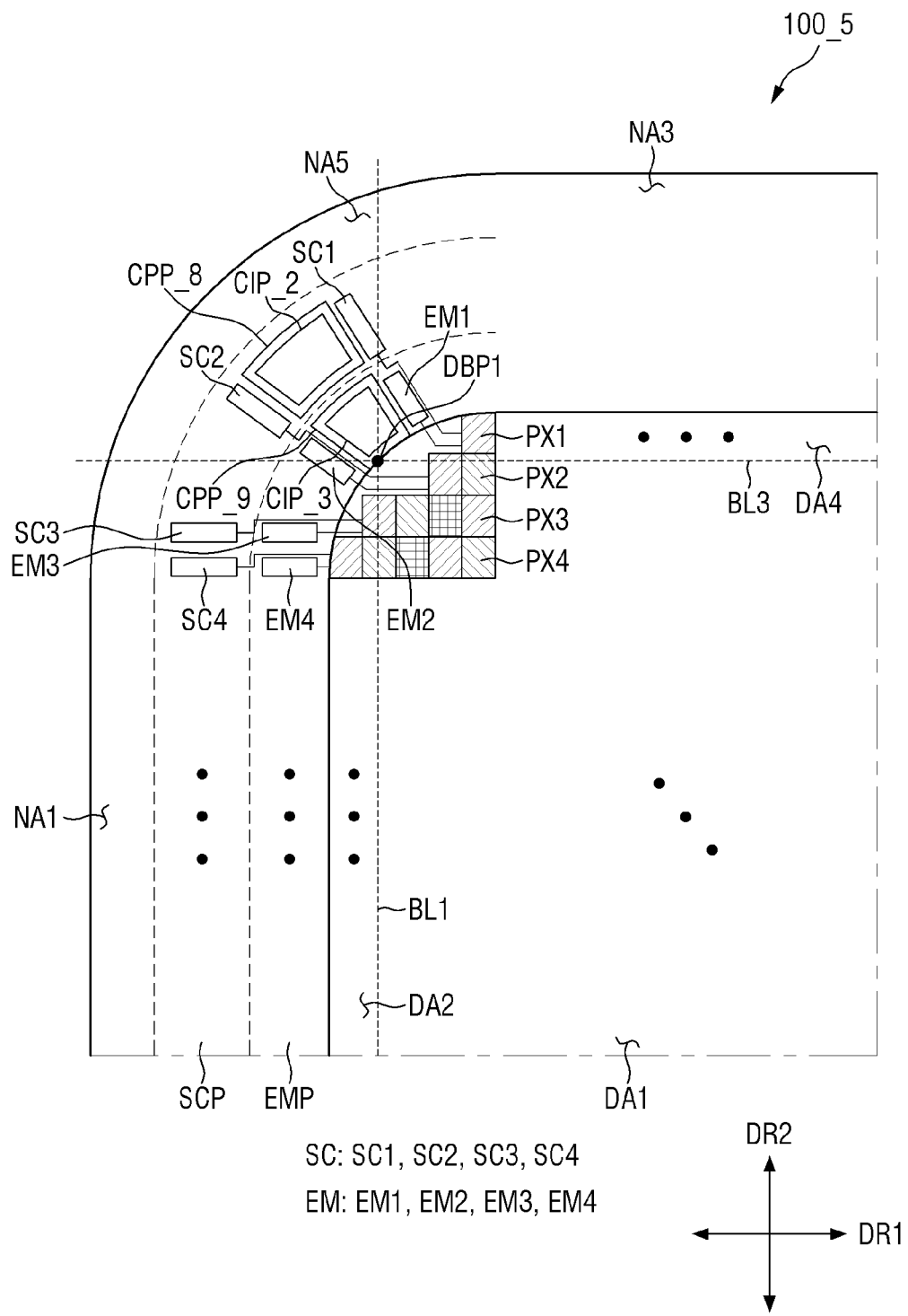
FIG. 21 is a partially enlarged plan view illustrating another embodiment of a display panel.

FIG. 21 is a partially enlarged plan view illustrating another embodiment of a display panel.

Referring to FIG. 21, a display panel 100_5 according to this embodiment is different from the display panel 100_2 of FIG. 16 in that it includes crack induction patterns CIP_2 and CIP_3 inside crack propagation prevention patterns CPP_8 and CPP_9 in the plan view.

Figure 22A:
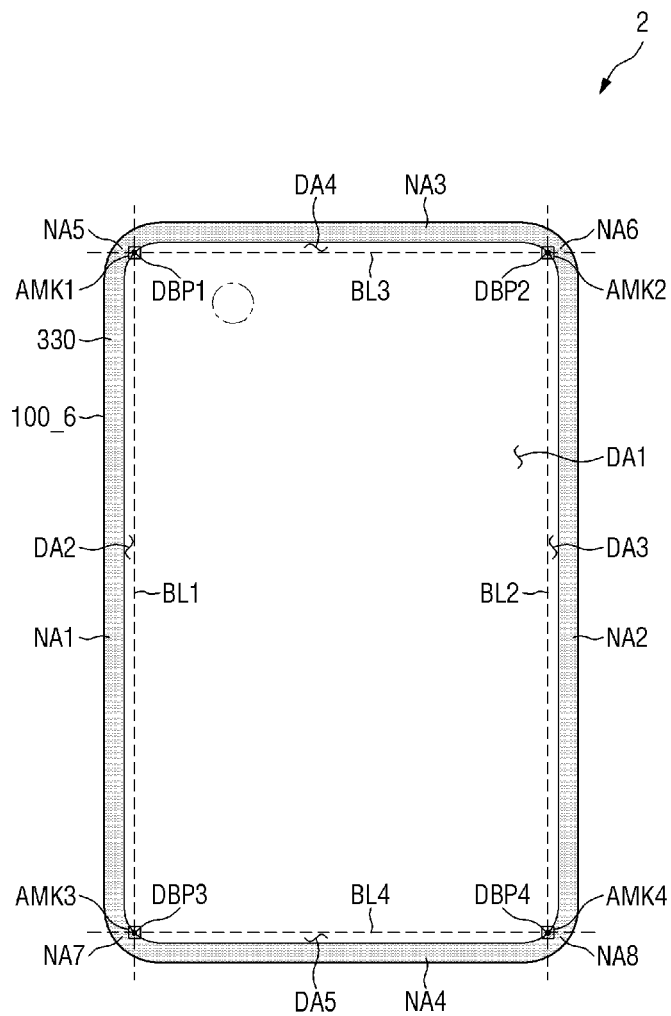
FIG. 22A is a plan view illustrating a display panel.
Figure 22A:
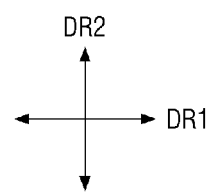
Figure 22B:
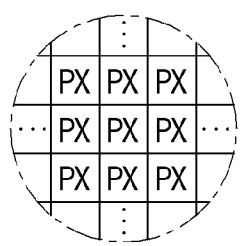
FIG. 22B is an enlarged view of a dotted circle portion of FIG. 22A.
Figure 23:
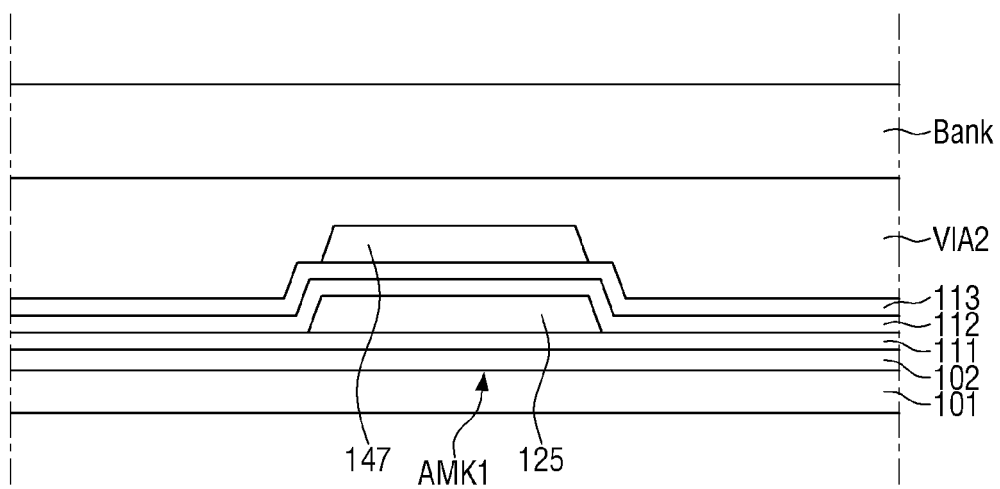
FIG. 23 is a cross-sectional view illustrating another embodiment of the embodiment according to FIGS. 22A and 22B.

FIG. 22A is a plan view illustrating another embodiment of a display panel, FIG. 22B is an enlarged view of a dotted circle portion of FIG. 22A, and FIG. 23 is a cross-sectional view illustrating the embodiment according to FIGS. 22A and 22B.

Referring to FIGS. 22A to 23, a display panel 100_6 of the display device 2 according to this embodiment is different from the display panel 100 in an embodiment in that it further includes align marks AMK1 to AMK4 of the respective bending lines BL1 to BL4.

In more detail, the align marks AMK1 to AMK4 may respectively be disposed at corner portions of the display panel 100_6. The align marks AMK1 to AMK4 may respectively be disposed at the intersection points of the bending lines BL1 to BL4. The first align mark AMK1 may be disposed at the intersection point of the first bending line BL1 and the third bending line BL3, the second align mark AMK2 may be disposed at the intersection point of the second bending line BL2 and the third bending line BL3, the third align mark AMK3 may be disposed at the intersection point of the first bending line BL1 and the fourth bending line BL4, and the fourth align mark AMK4 may be disposed at the intersection point of the second bending line BL2 and the fourth bending line BL4.

Each of the align marks AMK1 to AMK4 may include a plurality of deposited conductive patterns. The deposited conductive patterns may substantially be equal to one another in their sizes in the plan view, and may be disposed to overlap one another in a thickness direction. In an embodiment, as shown in FIG. 23, the first conductive layer may include a first align conductive pattern 125, and the third conductive layer may include a second align conductive pattern 147, for example. The first align conductive pattern 125 and the second align conductive pattern 147 may substantially be equal to each other in their sizes in the plan view, and may be disposed to overlap each other in a thickness direction. In some embodiments, the second conductive layer may further include a third align conductive pattern equal to the first align conductive pattern 125 in size in the plan view and disposed to overlap the first align conductive pattern 125 in a thickness direction, and the fourth conductive layer may further include a fourth align conductive pattern equal to the first align conductive pattern 125 in size in the plan view and disposed to overlap the first align conductive pattern 125 in a thickness direction. In this case, the respective align marks AMK1 to AMK4 may include the first align conductive pattern 125, the second align conductive pattern 147, the third align conductive pattern and/or the fourth align conductive pattern.

Figure 24A:
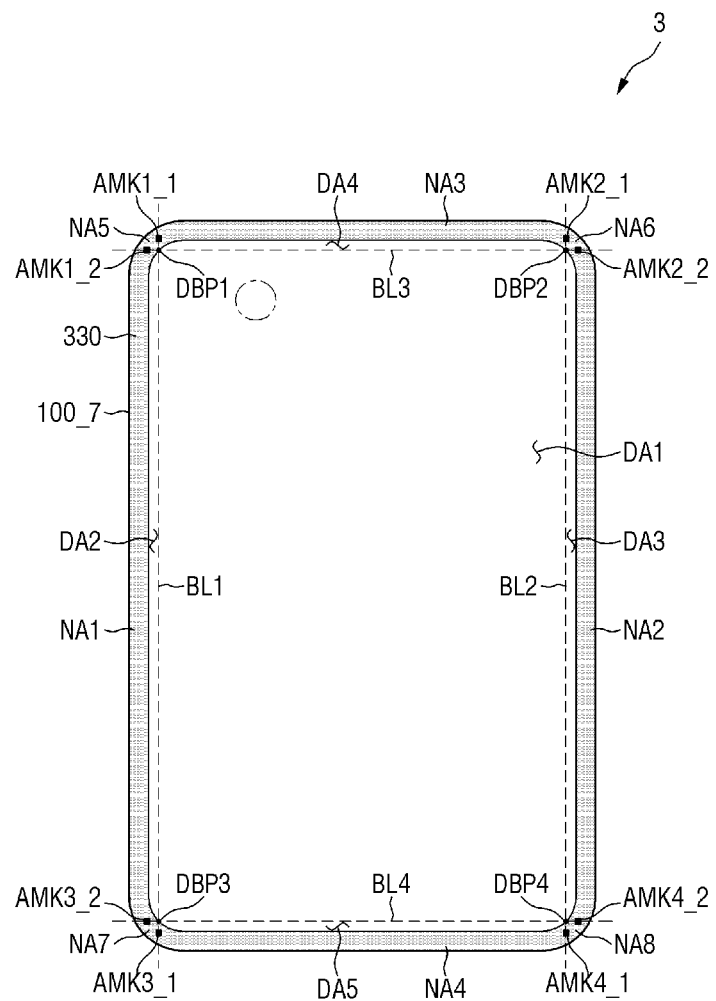
FIG. 24A is a plan view illustrating another embodiment of a display panel.
Figure 24A:
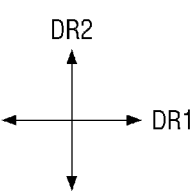
Figure 24B:
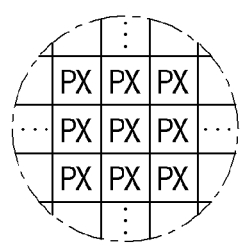
FIG. 24B is an enlarged view of a dotted circle portion of FIG. 24A.

FIG. 24A is a plan view illustrating another embodiment of a display panel, and FIG. 24B is an enlarged view of a dotted circle portion of FIG. 24A.

Referring to FIGS. 24A and 24B, a display panel 100_7 of the display device 3 is different from the display panel 100_6 of FIGS. 22A and 22B in that two align marks are disposed at respective corner portions of the display panel 100_7.

In more detail, the respective align marks may be disposed inside the display panel 100_7. In an embodiment, a (1-1)th align mark AMK1_1 may be disposed to overlap the first bending line BL1 and disposed at one side of the second direction DR2 rather than the third bending line BL3, for example. A (1-2)th align mark AMK1_2 may be disposed to overlap the third bending line BL3 and disposed at the other side of the first direction DR1 rather than the first bending line BL1. A (2-1)th align mark AMK2_1 may be disposed to overlap the second bending line BL2 and disposed at one side of the second direction DR2 rather than the third bending line BL3. A (2-2)th align mark AMK2_2 may be disposed to overlap the third bending line BL3 and disposed at one side of the first direction DR1 rather than the second bending line BL2. A (3-1)th align mark AMK3_1 may be disposed to overlap the first bending line BL1 and disposed at the other side of the second direction DR2 rather than the fourth bending line BL4. A (3-2)th align mark AMK3_2 may be disposed to overlap the fourth bending line BL4 and disposed at the other side of the first direction DR1 rather than the first bending line BL1. A (4-1)th align mark AMK4_1 may be disposed to overlap the second bending line BL2 and disposed at the other side of the second direction DR2 rather than the fourth bending line BL4. A (4-2)th align mark AMK4_2 may be disposed to overlap the fourth bending line BL4 and disposed at one side of the first direction DR1 rather than the second bending line BL2.

Figure 25A:
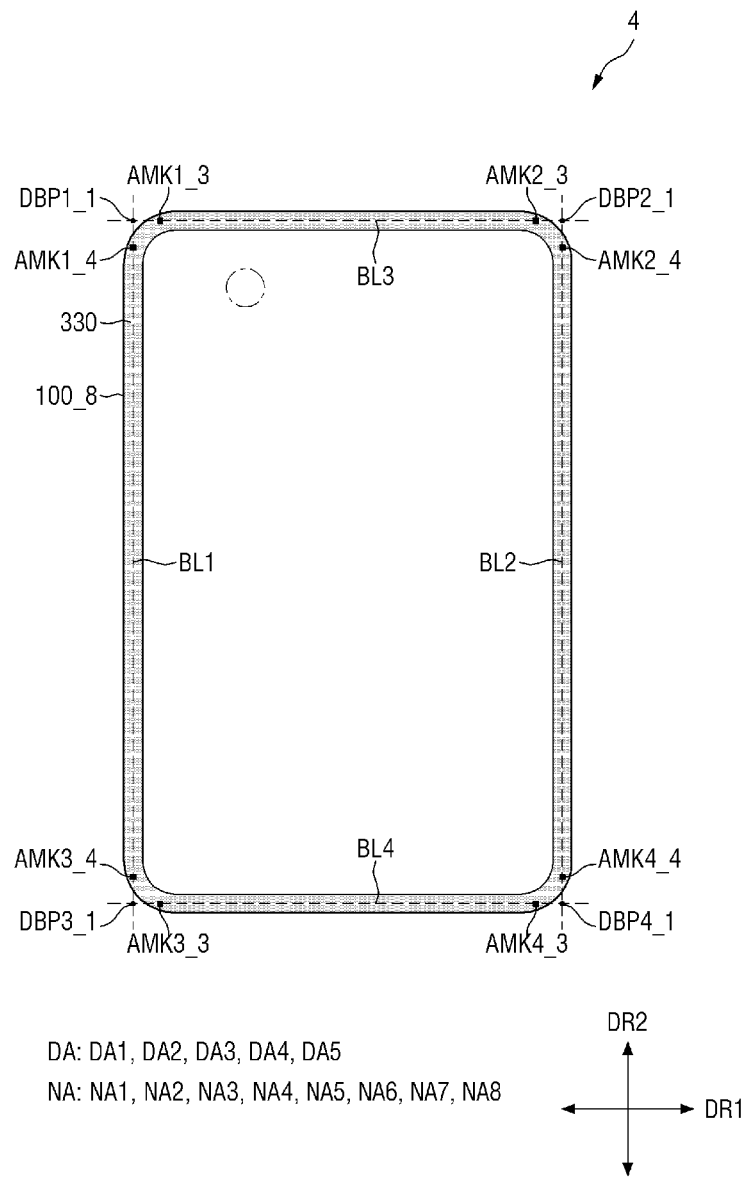
FIG. 25A is a plan view illustrating another embodiment of a display panel.
Figure 25B:
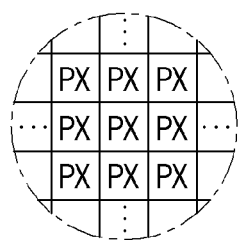
FIG. 25B is an enlarged view of a dotted circle portion of FIG. 25A.

FIG. 25A is a plan view illustrating another embodiment of a display panel, and FIG. 25B is an enlarged view of a dotted circle portion of FIG. 25A.

Referring to FIGS. 25A and 25B, in a display panel 100_8 of the display device 4 according to this embodiment, intersection points DBP1_1 to DBP4_1 of the bending lines BL1 to BL4 are formed or provided outside corner portions of the display panel 100_8.

In more detail, respective align marks of the display panel 100_8 according to this embodiment may be disposed inside the display panel 100_8. In an embodiment, a (1-3)th align mark AMK1_3 may be disposed to overlap the third bending line BL3 and disposed at one side of the second direction DR2 rather than the first bending line BL1, for example. A (1-4)th align mark AMK1_4 may be disposed to overlap the first bending line BL1 and disposed at the other one side of the first direction DR1 rather than the third bending line BL3. A (2-3)th align mark AMK2_3 may be disposed to overlap the third bending line BL3 and disposed at one side of the second direction DR2 rather than the second bending line BL2. A (2-4)th align mark AMK2_4 may be disposed to overlap the second bending line BL2 and disposed at one side of the first direction DR1 rather than the third bending line BL3. A (3-3)th align mark AMK3_3 may be disposed to overlap the fourth bending line BL4 and disposed at the other side of the second direction DR2 rather than the first bending line BL1. A (3-4)th align mark AMK3_4 may be disposed to overlap the first bending line BL1 and disposed at the other side of the first direction DR1 rather than the fourth bending line BL4. A (4-3)th align mark AMK4_3 may be disposed to overlap the fourth bending line BL4 and disposed at the other side of the second direction DR2 rather than the second bending line BL2. A (4-4)th align mark AMK4_4 may be disposed to overlap the second bending line BL2 and disposed at one side of the first direction DR1 rather than the fourth bending line BL4.

Although the embodiments of the invention have been described with reference to the accompanying drawings, it will be apparent to those skilled in the art that the invention may be embodied in other predetermined forms without departing from the spirit and essential characteristics of the specification. The above embodiments are therefore to be construed in all features as illustrative and not restrictive.

The invention claimed is:
1. A display device comprising:
   a display panel including:
      a corner portion;
      a display area including a plurality of pixels;
      a non-display area positioned in a periphery of the display area;
      a flat portion including a first display area of the display area;
      a first side portion bent in a thickness direction based on a first bending line extended from a first side of the flat portion along a first direction, the first side portion including a first non-display area of the non-display area, and a second display area of the display area disposed between the first non-display area and the first display area;
      a second side portion bent in the thickness direction based on a second bending line extended from a second side of the flat portion along a second direction crossing the first direction, the second side portion including a second non-display area of the non-display area, and a third display area of the display area disposed between the second non-display area and the first display area;
      a third side portion surrounded by the corner portion, the first bending line and the second bending line and bent in the thickness direction based on the first bending line and the second bending line, the third side portion including a third non-display area of the non-display area;
      a flexible substrate; and
      a crack propagation prevention pattern disposed on the flexible substrate and including a first organic layer directly contacting the flexible substrate; and
   a cover window disposed on the display panel,
   wherein an intersection point of the first bending line and the second bending line is positioned in the third non-display area,
the intersection point overlaps the crack propagation prevention pattern in the thickness direction.

2. The display device of claim 1, wherein each of the first non-display area to the third non-display area includes a plurality of scan driving circuits spaced apart from one another and connected with pixels of the display area adjacent thereto among the plurality of pixels, and a spaced distance between adjacent scan driving circuits of the third non-display area among the plurality of scan driving circuits is greater than a spaced distance between adjacent scan driving circuits of the first non-display area among the plurality of scan driving circuits.

3. The display device of claim 2, wherein the crack propagation prevention pattern is disposed in a gap space between the adjacent scan driving circuits of the third non-display area in a plan view.

4. The display device of claim 3, wherein each of the first non-display area to the third non-display area includes a plurality of light emission control driving circuits spaced apart from one another and connected with the pixels of the display area adjacent thereto, and a spaced distance between adjacent light emission control driving circuits of the third non-display area among the plurality of light emission control driving circuits is greater than a spaced distance between adjacent light emission control driving circuits of the first non-display area among the plurality of light emission control driving circuits.

5. The display device of claim 4, wherein the scan driving circuit and the light emission control driving circuit, which are connected to a same pixel among the plurality of pixels, are aligned in a direction oriented toward the display area adjacent thereto.

6. The display device of claim 5, wherein the crack propagation prevention pattern is disposed even in a gap space between the adjacent light emission control driving circuits of the third non-display area in the plan view.

7. The display device of claim 3, wherein the crack propagation prevention pattern is further disposed in a gap space between the scan driving circuit of the third non-display area and the scan driving circuit of the first non-display area, which are adjacent to each other in the plan view.

8. The display device of claim 1, wherein the display panel includes a buffer layer disposed on the flexible substrate, a first insulating layer disposed on the buffer layer and a second insulating layer disposed on the first insulating layer, and the buffer layer, an open portion is defined in the first insulating layer and the second insulating layer in an area overlapped with the crack propagation prevention pattern.

9. The display device of claim 8, wherein the crack propagation prevention pattern contacts exposed sides of the buffer layer, the first insulating layer and the second insulating layer.

10. The display device of claim 8, wherein the display panel further includes a second organic layer disposed on the second insulating layer, and a third organic layer disposed on the second organic layer, and the crack propagation prevention pattern further includes the second organic layer and the third organic layer, which overlap the first organic layer.

11. The display device of claim 1, wherein an inorganic material is not disposed in an area overlapped with the crack propagation prevention pattern in the thickness direction.

12. The display device of claim 1, wherein the display panel further includes a crack induction pattern disposed on the flexible substrate and surrounded by the crack propagation prevention pattern in a plan view, and the crack induction pattern includes an inorganic layer.

13. The display device of claim 12, wherein the crack induction pattern further includes a conductive layer.

14. The display device of claim 12, wherein a side of the crack induction pattern directly contacts the crack propagation prevention pattern.

15. A display device comprising:
a display panel including:
a corner portion;
a display area and a non-display area positioned in a periphery of the display area;
a flat portion;
a first side portion bent in a thickness direction based on a first bending line extended from a first side of the flat portion along a first direction;
a second side portion bent in the thickness direction based on a second bending line extended from a second side of the flat portion along a second direction crossing the first direction;
a third side portion surrounded by the corner portion, the first bending line and the second bending line and bent in the thickness direction based on the first bending line and the second bending line;
a first align mark overlapping the first bending line and disposed on the second side portion and the third side portion in a plan view; and
a second align mark overlapping the second bending line and disposed on the first side portion and the third side portion in the plan view; and
a cover window disposed on the display panel.

16. The display device of claim 15, wherein the first align mark and the second align mark include a plurality of deposited conductive layers having a same size in the plan view.

17. The display device of claim 16, wherein the first bending line and the second bending line respectively pass through the flat portion.

18. The display device of claim 17, wherein each of the first align mark and the second align mark includes an intersection point of the first bending line and the second bending line.

19. The display device of claim 16, wherein the intersection point of the first bending line and the second bending line is positioned outside the corner portion.

20. The display device of claim 15, wherein the display panel further includes a third side portion bent in the thickness direction based on a third bending line extended from a third side of the flat portion along the first direction, and a fourth side portion bent in the thickness direction based on a fourth bending line extended from a fourth side of the flat portion along the second direction, the first bending line and the third bending line are parallel with each other, and the second bending line and the fourth bending line are parallel with each other.

* * * * *